US012760042B2

(12) United States Patent
Cho et al.

(10) Patent No.: US 12,760,042 B2
(45) Date of Patent: Oct. 13, 2026

(54) ALUMINUM PRECURSOR, METHOD OF FORMING A THIN LAYER USING THE SAME, METHOD OF MANUFACTURING THE SAME, AND METHOD OF MANUFACTURING MEMORY DEVICE

(71) Applicant: EGTM Co., Ltd., Suwon-si (KR)

(72) Inventors: Kyu Ho Cho, Suwon-si (KR); Ha Na Kim, Suwon-si (KR); Jae Min Kim, Suwon-si (KR); Ji Yeon Han, Suwon-si (KR); Duck Hyeon Seo, Suwon-si (KR); Ju Hwan Jeong, Suwon-si (KR); Hyun Ju Jung, Suwon-si (KR); Hyeon Sik Cho, Suwon-si (KR); Myeong Il Kim, Suwon-si (KR)

(73) Assignee: EGTM CO., LTD., Suwon-si (KR)

( * ) Notice: Subject to any disclaimer, the term of this patent is extended or adjusted under 35 U.S.C. 154(b) by 557 days.

(21) Appl. No.: 18/314,840

(22) Filed: May 10, 2023

(65) Prior Publication Data

US 2023/0287014 A1 Sep. 14, 2023

(30) Foreign Application Priority Data

May 10, 2022 (KR) ........................ 10-2022-0057133
Sep. 7, 2022 (KR) ........................ 10-2022-0113688
Jan. 16, 2023 (KR) ........................ 10-2023-0006158

(51) Int. Cl.
*C07F 5/06* (2006.01)
*C23C 16/40* (2006.01)
*C23C 16/455* (2006.01)
*H10P 14/60* (2026.01)
*H10P 14/692* (2026.01)

(52) U.S. Cl.
CPC ............ *C07F 5/062* (2013.01); *C23C 16/403* (2013.01); *C23C 16/45553* (2013.01); *H10P 14/6339* (2026.01); *H10P 14/668* (2026.01); *H10P 14/69391* (2026.01)

(58) Field of Classification Search
CPC ............... C07F 5/062; H10P 14/69391; H10P 14/6339; H10P 14/668; C23C 16/403; C23C 16/45553
See application file for complete search history.

(56) References Cited

U.S. PATENT DOCUMENTS

2020/0365447 A1 11/2020 Mays et al.

FOREIGN PATENT DOCUMENTS

CN 101522695 A 9/2009
JP 2004-183046 A 7/2004
KR 10-2014-0143040 A 12/2014
KR 10-2016-0101697 A 8/2016
KR 10-1965219 B1 4/2019
WO 2021141324 A1 7/2021

OTHER PUBLICATIONS

The Infrared and Raman Spectra of the T'rimethylaluminum Dimethyl Sulfide Complex, Tarao (Bulletin of the Chemical Society of Japan, vol. 39, Issue 10, Oct. 1966, pp. 2132-2134).*
Crystal structure and quantum-chemical calculations of a trimethylaluminium—THF adduct, Brieger et al. (Acta Cryst. (2018). E74, 267-270).*
Chen Zhenhuan et al., "New Readings in Inorganic Chemistry", Shaanxi People's Education Press, May 1988, pp. 517-518.
STN Search Result.
Chinese Office Action mailed on May 30, 2025.
Chinese Office Action mailed on Mar. 30, 2026.
(Continued)

*Primary Examiner* — Haidung D Nguyen
(74) *Attorney, Agent, or Firm* — You & IP, LLC

(57) ABSTRACT

Disclosed is a method for manufacturing an aluminum precursor formed by mixing 1 to 3 moles of a compound represented by the following Chemical Formula 1 or following Chemical Formula 2 and 1 to 3 moles of a compound represented by the following Chemical Formula 3.

<Chemical Formula 1>

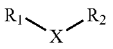

wherein X is O or S, and R1 or R2 is each independently selected from an alkyl group having 1 to 8 carbon atoms, a cycloalkyl group having 3 to 6 carbon atoms, and an aryl group having 6 to 12 carbon atoms.

<Chemical Formula 2>

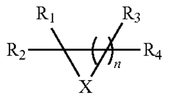

wherein X is O or S, n is 1 to 5, and R1 to R4 are each independently selected from a hydrogen atom, an alkyl group having 1 to 5 carbon atoms, a cycloalkyl group having 3 to 6 carbon atoms, and an aryl group having 6 to 12 carbon atoms.

<Chemical Formula 3>

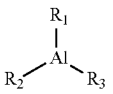

wherein R1, R2 and R3 are different from each other, and each independently selected from a hydrogen atom, an alkyl group having 1 to 6 carbon atoms, a dialkylamine having 1 to 6 carbon atoms, a cycloamine group having 1 to 6 carbon atoms, or a halogen atom.

2 Claims, 22 Drawing Sheets

(56) References Cited

OTHER PUBLICATIONS

Korean Office Action mailed on Feb. 2, 2026.
Non-Final Office Action of U.S. Appl. No. 18/314,842 mailed on May 12, 2026.

* cited by examiner

Highly Reactive TMA on Surface OH

Less Reactive TMA-Adduct on Surface OH

| Feeding time(s) | 0.5 | 1 | 2 | 3 | 4 |
|---|---|---|---|---|---|
| TMA only | 0.69 | 0.74 | 0.77 | 0.79 | 0.81 |
| TMA+TMOF | 0.27 | 0.4 | 0.48 | 0.55 | 0.56 |
| Decrease rate | 60.9% | 45.9% | 37.7% | 30.4% | 30.9% |

| Feeding time(s) | 1 | 3 | 5 | 7 |
|---|---|---|---|---|
| TMA-THF | 0.33 | 0.55 | 0.65 | 0.64 |
| TMA-THF + TMOF | 0.11 | 0.17 | 0.20 | 0.22 |
| Decrease rate | 66.1% | 68.8% | 68.8% | 66.5% |

ALUMINUM PRECURSOR, METHOD OF FORMING A THIN LAYER USING THE SAME, METHOD OF MANUFACTURING THE SAME, AND METHOD OF MANUFACTURING MEMORY DEVICE

TECHNICAL FIELD

The present invention relates to an aluminum precursor, a method of forming a thin layer using the same, a method of manufacturing an aluminum precursor, and a method of manufacturing a memory device, and more particularly, an aluminum precursor having excellent safety, easy control of the thickness of a thin layer, and excellent step coverage characteristics, a method of forming a thin layer using the same, a method of manufacturing an aluminum precursor, and a method of manufacturing a memory device.

BACKGROUND

The existing 2D NAND Flash process showed technical limitations in that interference between cells and leakage intensified as the degree of integration increased in a small area. To overcome these disadvantages, 3D NAND Flash technology that vertically stacks cells has emerged.

The advantage of 3D NAND Flash including a multilayer stack is that it greatly reduces interference between cells to improve characteristics, and increases data capacity and cost reduction by increasing the stack. As a result, compared to conventional NAND memory devices, it has more than twice the write speed, more than ten times more endurance, and half the power consumption.

However, as the height increases with ultra-high stacking of 90 or more layers, it becomes more difficult to secure a uniform thin film on the sidewall, and limitations such as a difference in characteristics between the uppermost cell and the lowermost cell occur. Therefore, there is an increasing demand for a manufacturing method capable of forming a thin film of uniform thickness with excellent step coverage on a three-dimensional structure with a large aspect ratio.

In addition, thin films containing aluminum play a very important role in the manufacture of semiconductor devices. The thin film containing aluminum includes an aluminum film, an aluminum nitride film, an aluminum carbonized nitride film, an aluminum oxide film and an aluminum oxynitride film, etc., and the aluminum nitride film and aluminum oxide film play an important role as a passivation layer, an interlayer insulating film or a capacitor dielectric layer, etc.

Currently, trimethylaluminum (TMA) or triisobutylaluminum is used as a precursor for depositing a thin film containing aluminum, but these materials are explosively flammable and require considerable care when handling.

An object of the present invention is to provide an aluminum precursor with excellent vaporization characteristics and thermal stability, a method for forming a thin film using the same, a method for manufacturing an aluminum precursor, and a method for manufacturing a memory device.

Another object of the present invention is to provide an aluminum precursor having good step coverage, a method for forming a thin film using the same, a method for manufacturing an aluminum precursor, and a method for manufacturing a memory device.

Another object of the present invention is to provide an aluminum precursor capable of forming a thin film with a very uniform thickness and easily controlling the thickness, a method for forming a thin film using the same, a method for manufacturing an aluminum precursor, and a method for manufacturing a memory device.

Other objects of the present invention will become more apparent from the following detailed description.

SUMMARY

Disclosed is a method for manufacturing an aluminum precursor formed by mixing 1 to 3 moles of a compound represented by the following Chemical Formula 1 or following Chemical Formula 2 and 1 to 3 moles of a compound represented by the following Chemical Formula 3.

<Chemical Formula 1>

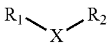

wherein X is O or S, and R1 or R2 is each independently selected from an alkyl group having 1 to 8 carbon atoms, a cycloalkyl group having 3 to 6 carbon atoms, and an aryl group having 6 to 12 carbon atoms.

<Chemical Formula 2>

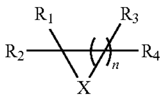

wherein X is O or S, n is 1 to 5, and R1 to R4 are each independently selected from a hydrogen atom, an alkyl group having 1 to 5 carbon atoms, a cycloalkyl group having 3 to 6 carbon atoms, and an aryl group having 6 to 12 carbon atoms.

<Chemical Formula 3>

wherein R1, R2 and R3 are different from each other, and each independently selected from a hydrogen atom, an alkyl group having 1 to 6 carbon atoms, a dialkylamine having 1 to 6 carbon atoms, a cycloamine group having 1 to 6 carbon atoms, or a halogen atom.

The aluminum precursor may be formed by mixing ethyl methyl sulfide and trimethylaluminum.

The aluminum precursor may be formed by mixing ethyl propyl ether and trimethylaluminum.

Disclosed is an aluminum precursor formed by mixing 1 to 3 moles of a compound represented by the following Chemical Formula 1 or following Chemical Formula 2 and 1 to 3 moles of a compound represented by the following Chemical Formula 3.

<Chemical Formula 1>

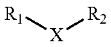

wherein X is O or S, and R1 or R2 is each independently selected from an alkyl group having 1 to 8 carbon atoms, a cycloalkyl group having 3 to 6 carbon atoms, and an aryl group having 6 to 12 carbon atoms.

<Chemical Formula 2>

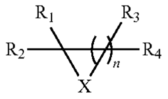

wherein X is O or S, n is 1 to 5, and R1 to R4 are each independently selected from a hydrogen atom, an alkyl group having 1 to 5 carbon atoms, a cycloalkyl group having 3 to 6 carbon atoms, and an aryl group having 6 to 12 carbon atoms.

<Chemical Formula 3>

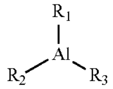

wherein R1, R2 and R3 are different from each other, and each independently selected from a hydrogen atom, an alkyl group having 1 to 6 carbon atoms, a dialkylamine having 1 to 6 carbon atoms, a cycloamine group having 1 to 6 carbon atoms, or a halogen atom.

Disclosed is a method of forming a thin layer, the method comprising: supplying the above-mentioned aluminum precursor to the inside of a chamber in which a substrate is placed; purging the interior of the chamber; supplying a reaction material to the inside of the chamber so that the reaction material reacts with the aluminum precursor to form the thin layer.

Disclosed is a method of forming a thin layer using a surface protection material, the method comprising: supplying a metal precursor to the inside of a chamber in which a substrate is placed so that the metal precursor is adsorbed to the substrate; purging the interior of the chamber; and supplying a reaction material to the inside of the chamber so that the reaction material reacts with the adsorbed metal precursor to form the thin layer, wherein before forming the thin layer, the method further comprises: supplying the surface protection material to the inside of the chamber; and purging the interior of the chamber, wherein the metal precursor is formed by mixing 1 to 3 moles of a compound represented by the following Chemical Formula 1 or following Chemical Formula 2 and 1 to 3 moles of a compound represented by the following Chemical Formula 3.

<Chemical Formula 1>

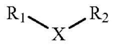

wherein X is O or S, and R1 or R2 is each independently selected from an alkyl group having 1 to 8 carbon atoms, a cycloalkyl group having 3 to 6 carbon atoms, and an aryl group having 6 to 12 carbon atoms.

<Chemical Formula 2>

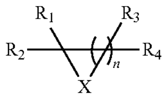

wherein X is O or S, n is 1 to 5, and R1 to R4 are each independently selected from a hydrogen atom, an alkyl group having 1 to 5 carbon atoms, a cycloalkyl group having 3 to 6 carbon atoms, and an aryl group having 6 to 12 carbon atoms.

<Chemical Formula 3>

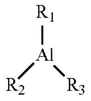

wherein R1, R2 and R3 are different from each other, and each independently selected from a hydrogen atom, an alkyl group having 1 to 6 carbon atoms, a dialkylamine having 1 to 6 carbon atoms, a cycloamine group having 1 to 6 carbon atoms, or a halogen atom.

The metal precursor may be formed by mixing ethyl methyl sulfide or ethyl propyl ether or tetrahydrofuran with trimethylaluminum.

The surface protection material may be represented by the following Chemical Formula 4:

<Chemical Formula 4>

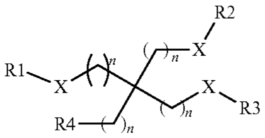

Wherein n is each independently an integer of 0 to 6, X is O or S, R1 to R3 are independently an alkyl group having 1 to 6 carbon atoms, R4 is selected from hydrogen, an alkyl group having 1 to 6 carbon atoms, an alkoxy group having 1 to 6 carbon atoms, and an alkylthio group having 1 to 6 carbon atoms.

The thin layer may be any one of aluminum oxide, aluminum nitride, aluminum sulfide.

The above-mentioned method may proceed at 50 to 700° C.

Disclosed is a method of manufacturing a volatile memory device, the method comprising the above-mentioned method of forming a thin layer.

Disclosed is a method of manufacturing a non-volatile memory device, the method comprising the above-mentioned method of forming a thin layer.

Advantageous Effects

According to the present invention, it is possible to form a thin layer with good step coverage. The surface protection material has a behavior similar to that of the metal precursor during the process, and is adsorbed at a high density on the top (or entrance) and at a low density on the bottom (or inner side) in the high aspect ratio structure. The surface protection material prevents adsorption of the metal precursor in the subsequent process. Therefore, the metal precursor can be uniformly adsorbed into the structure.

In particular, with excellent step coverage, it is possible to form a high-purity thin film without impurities while reducing the difference in characteristics of the uppermost and lowermost cells even in an ultra-high stacked structure, and improve the electrical characteristics and reliability of the device.

In addition, it is possible to prevent spontaneous ignition of the aluminum precursor by exposure to air, and it can be delivered to the substrate surface in a stable gas phase due to excellent thermal stability.

In particular, it is introduced together with a surface protection material to maximize its effect, thereby minimizing the deposition thickness per cycle to facilitate thickness control, and the deposited thin film can secure excellent uniformity and step coverage.

DETAILED DESCRIPTION

Hereinafter, embodiments of the present invention will be described using FIGS. 1 to 22. The embodiments of the present invention may include various modifications, and the scope of the present invention should not be construed to be limited to the embodiments described below.

According to the present invention, a method of forming a thin layer comprising: supplying an aluminum precursor to the inside of a chamber in which a substrate is placed; purging the interior of the chamber; supplying a reaction material to the inside of the chamber so that the reaction material reacts with the aluminum precursor to form the thin layer.

At this time, supplying the aluminum precursor and forming the thin layer are performed at 50 to 700° C. In addition, the thin layer may be any one of aluminum oxide, aluminum nitride, and aluminum sulfide.

According to the present invention, an aluminum precursor is formed by mixing 1 to 3 moles of a compound represented by the following Chemical Formula 1 or following Chemical Formula 2 and 1 to 3 moles of a compound represented by the following Chemical Formula 3.

<Chemical Formula 1>

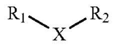

wherein X is O or S, and R1 or R2 is each independently selected from an alkyl group having 1 to 8 carbon atoms, a cycloalkyl group having 3 to 6 carbon atoms, and an aryl group having 6 to 12 carbon atoms.

<Chemical Formula 2>

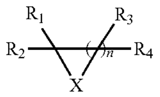

wherein X is O or S, n is 1 to 5, and R1 to R4 are each independently selected from a hydrogen atom, an alkyl group having 1 to 5 carbon atoms, a cycloalkyl group having 3 to 6 carbon atoms, and an aryl group having 6 to 12 carbon atoms.

<Chemical Formula 3>

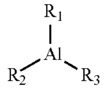

wherein R1, R2 and R3 are different from each other, and each independently selected from a hydrogen atom, an alkyl group having 1 to 6 carbon atoms, a dialkylamine having 1 to 6 carbon atoms, a cycloamine group having 1 to 6 carbon atoms, or a halogen atom.

The aluminum precursor may be formed by mixing ethyl methyl sulfide and trimethylaluminum.

The aluminum precursor may be formed by mixing ethyl propyl ether and trimethylaluminum.

Example 1

In a glove box at room temperature, 5.28 g (0.069 mol) of ethyl methyl sulfide was added to a 500 ml round flask and 5 g (0.069 mol) of trimethyl aluminum was added very slowly to obtain precursor X1.

Figure 1:
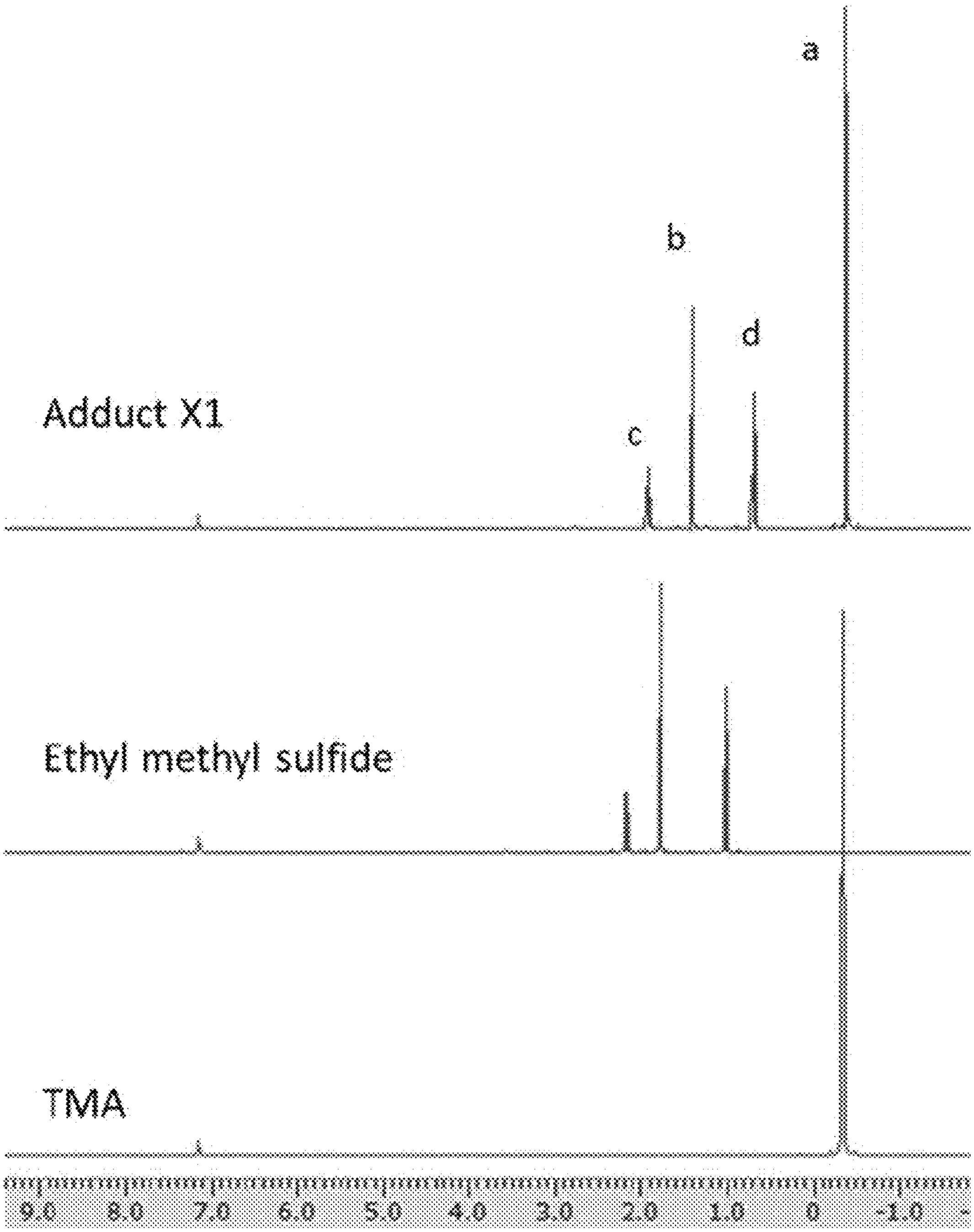
FIG. 1 is a 1H-NMR graph of precursor X1 according to Example 1 of the present invention.

FIG. 1 is a 1H-NMR graph of precursor X1 according to Example 1 of the present invention, and shows the NMR spectrum of Example 1/ethyl methyl sulfide/trimethyl aluminum.

The peaks at δ=2.19 ppm, 1.76 ppm, and 1.20 ppm with chemical shifts derived from ethyl methyl sulfide shifted to 1.92 ppm, 1.41 ppm, and 0.69 ppm, respectively, without changing the shape of the peaks even after the precursor X1 was formed.

It can be seen that the peak of chemical shift δ=−0.36 ppm derived from trimethyl aluminum also moves finely without changing its shape after the formation of precursor X1 to form a stable precursor. The integral ratio of Ha(9H):Hb(3H) is about 9:2.8, confirming that one molecule of ethyl methyl sulfide forms a precursor.

Example 2: Preparation of TMA-EMS

In a glove box at room temperature, 10.56 g (0.139 mol) of ethyl methyl sulfide was added to a 500 ml round flask and 5 g (0.069 mol) of trimethyl aluminum was added very slowly to obtain precursor X2 (TMA-EMS).

Figure 2:
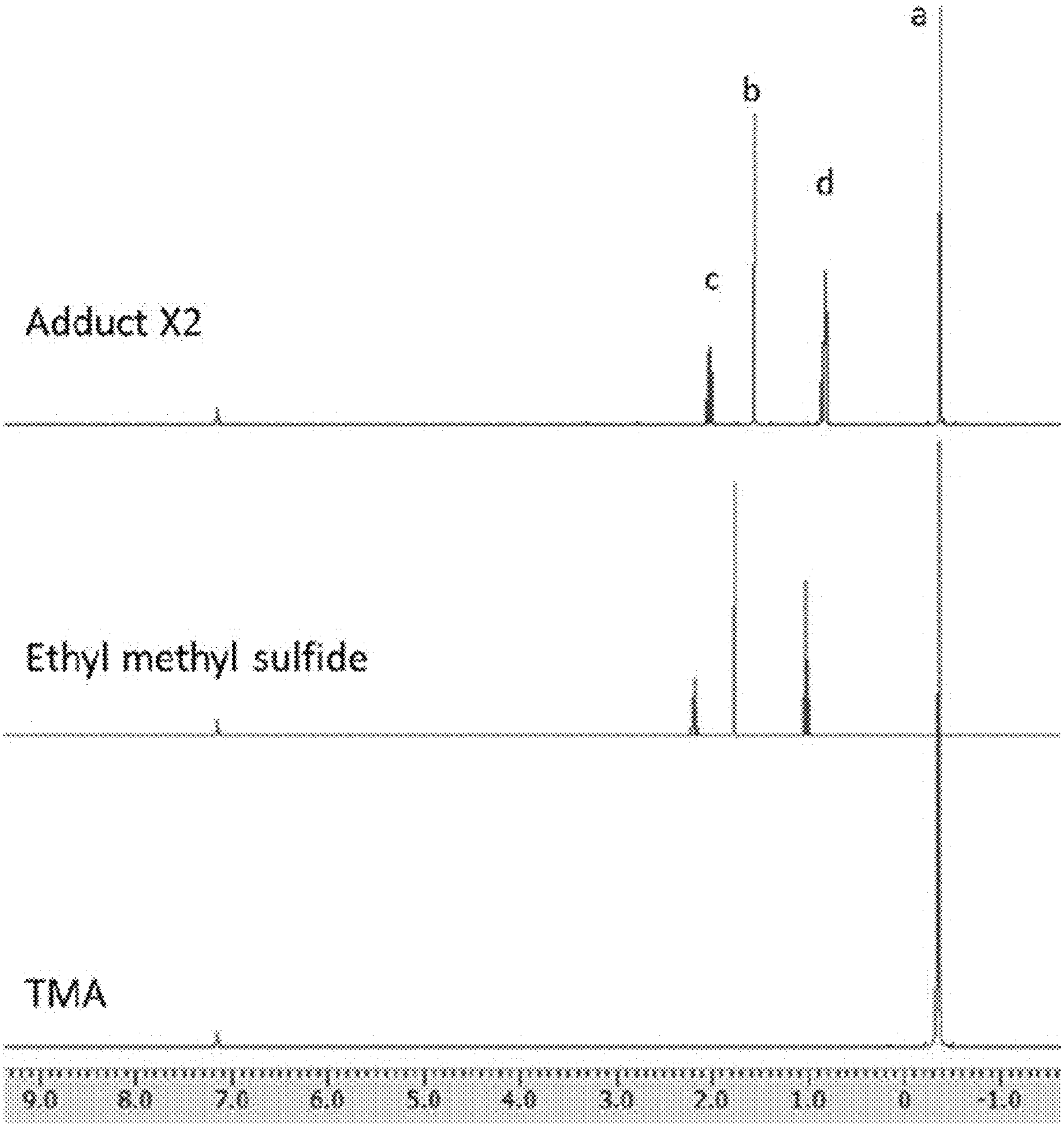
FIG. 2 is a 1H-NMR graph of precursor X2 according to Example 2 of the present invention.

FIG. 2 is a 1H-NMR graph of precursor X2 according to Example 2 of the present invention, and shows the NMR spectrum of Example 2/ethyl methyl sulfide/trimethyl aluminum.

The peaks at δ=2.19 ppm, 1.76 ppm, and 1.20 ppm with chemical shifts derived from ethyl methyl sulfide shifted to 2.05 ppm, 1.58 ppm, and 0.85 ppm, respectively, without changing the shape of the peaks even after the formation of precursor X2.

It was confirmed that the chemical shift peaks of δ=2.19 ppm, 1.76 ppm, and 1.20 ppm derived from EMS shifted to 2.05 ppm, 1.58 ppm, and 0.85 ppm, respectively, without changing the shape of the peaks even after precursor formation.

It can be seen that the peak of chemical shift δ=−0.36 ppm derived from trimethyl aluminum also moves finely without changing its shape after the formation of precursor X2 to form a stable precursor. It can be confirmed that the integral ratio of Ha(9H):Hb(3H) is about 9:5.7, and two molecules of ethyl methyl sulfide form a precursor.

Example 3

In a glove box at room temperature, 12.23 g (0.139 mol) of ethyl propyl ether was added to a 500 ml round flask and 5 g (0.069 mol) of trimethyl aluminum was added very slowly to obtain precursor Y2.

Figure 3:
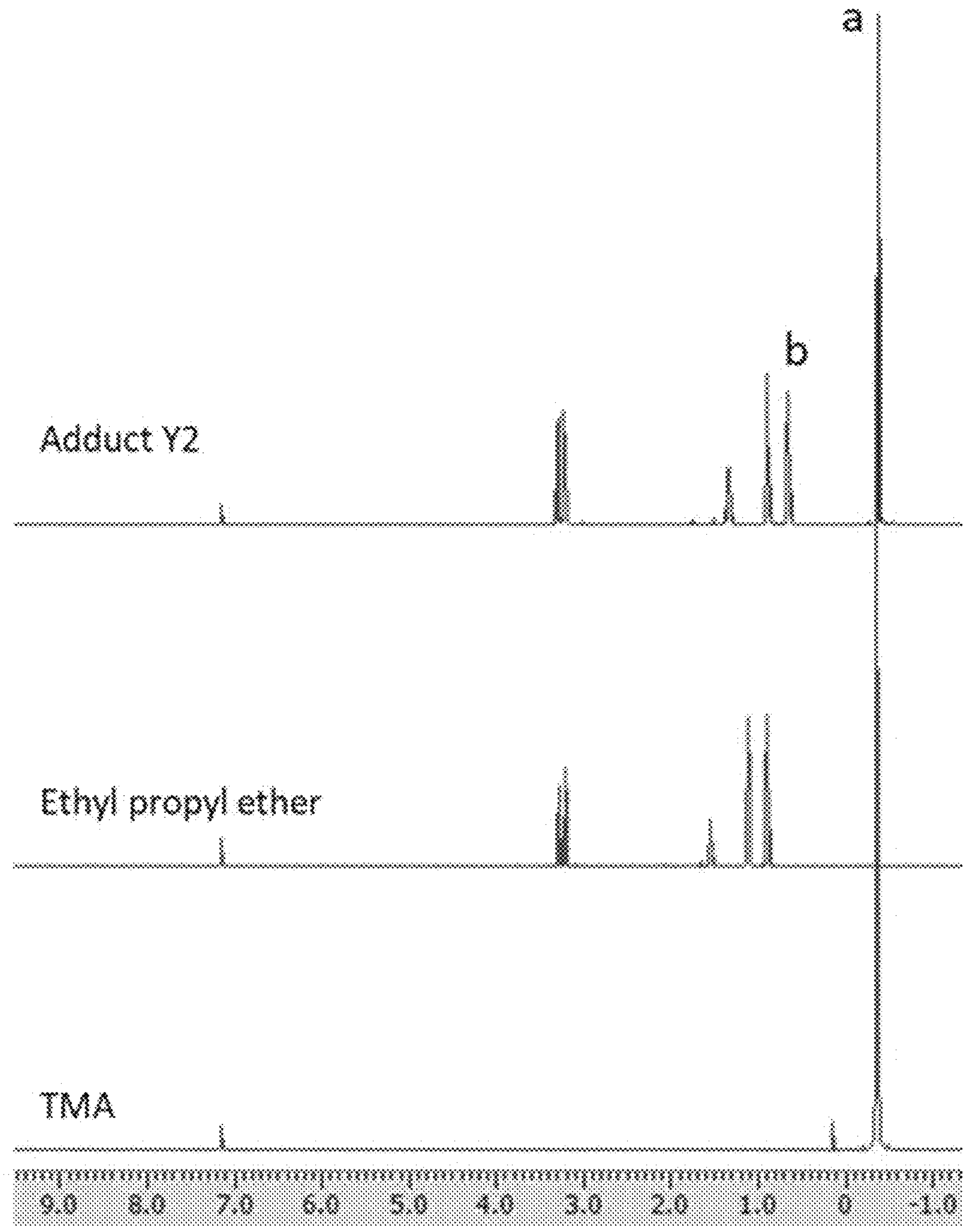
FIG. 3 is a 1H-NMR graph of precursor Y2 according to Example 3 of the present invention.
Figure 4:
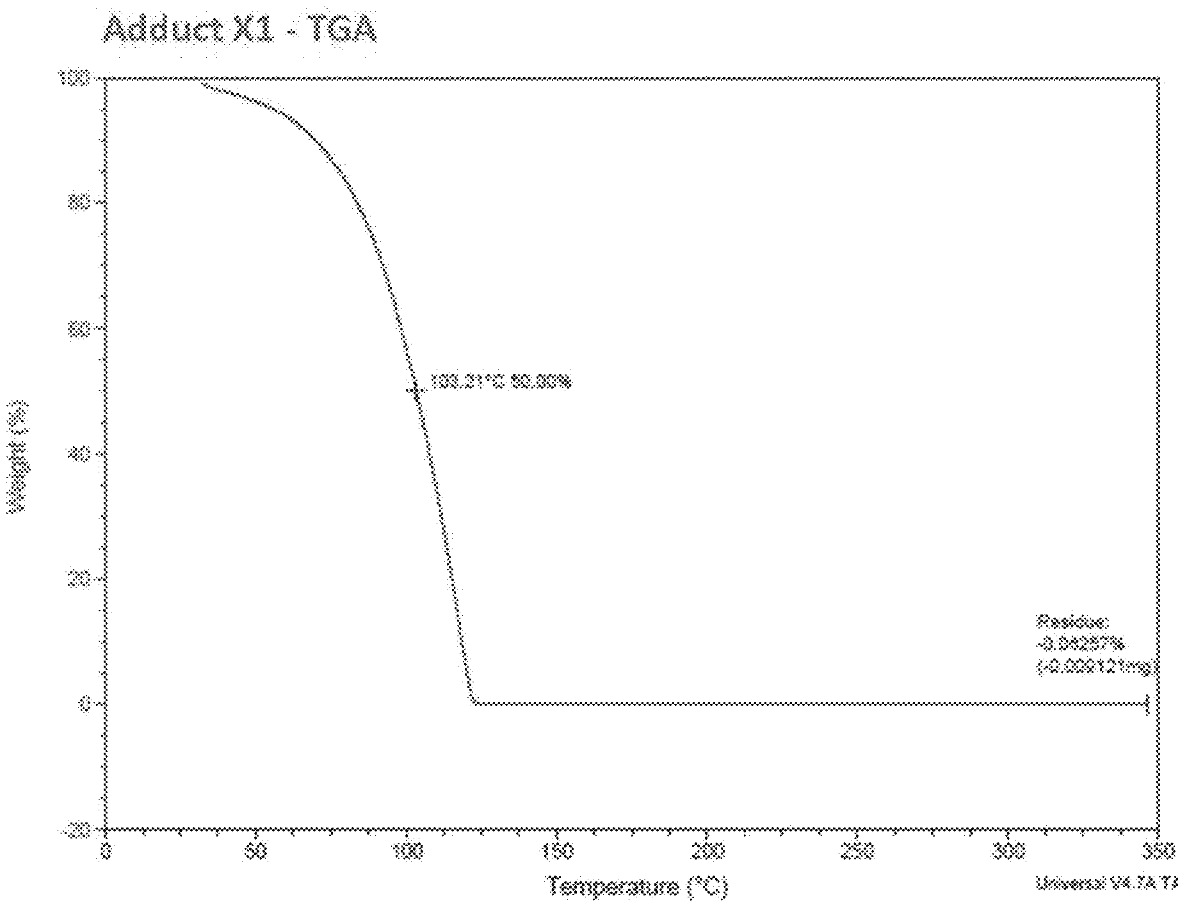
FIGS. 4 to 9 are graphs showing differential scanning calorimetry (DSC) test results and thermogravimetric analysis (TGA) test results for Examples 1 to 3.
Figure 5:
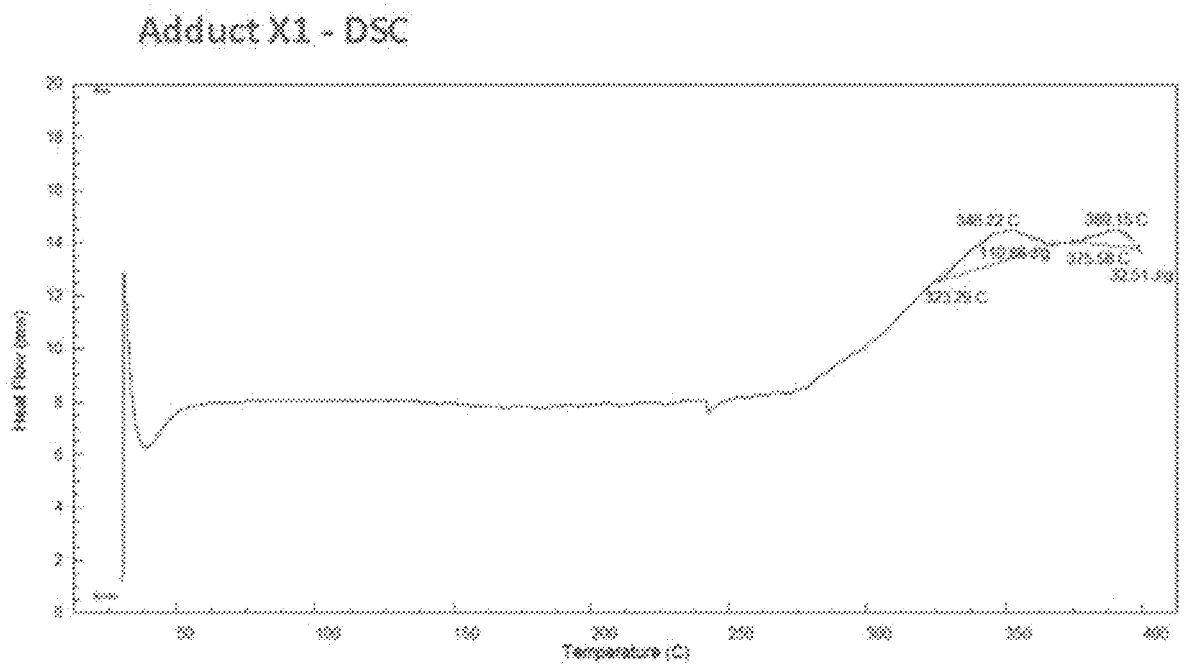
Figure 6:
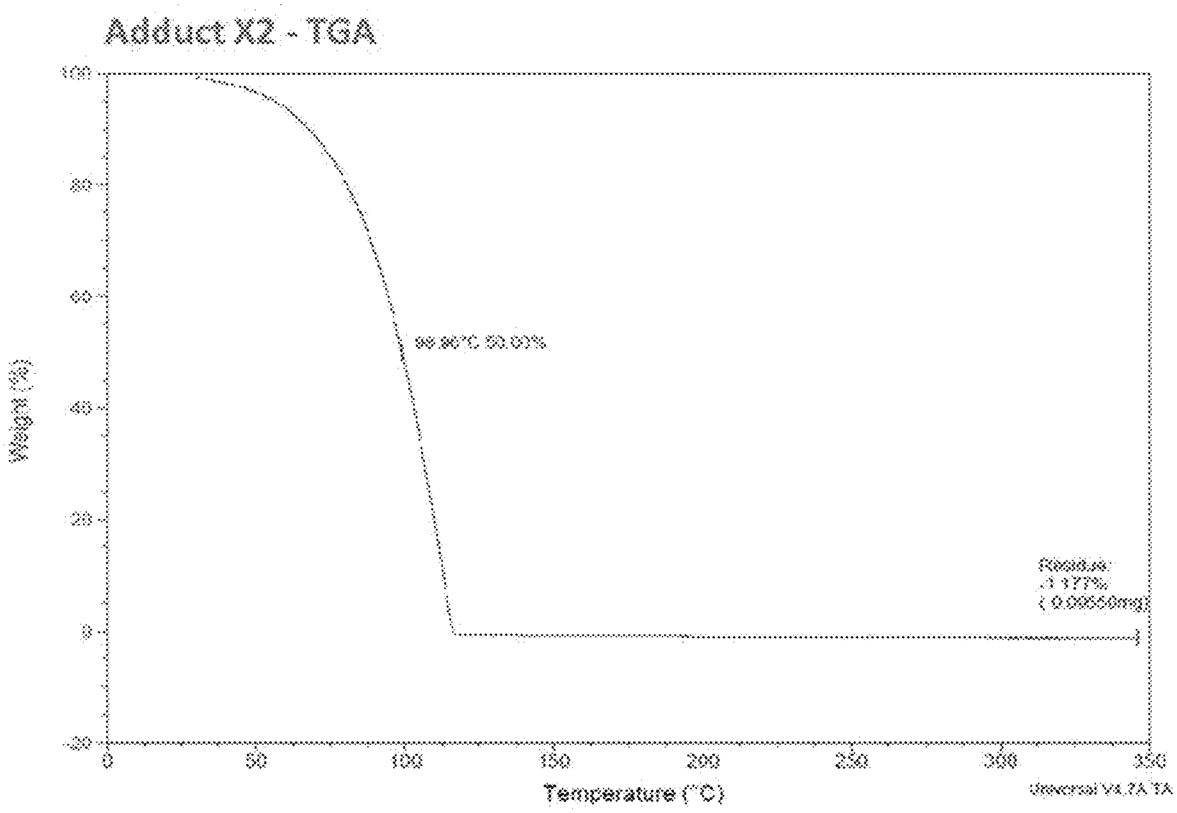
Figure 7:
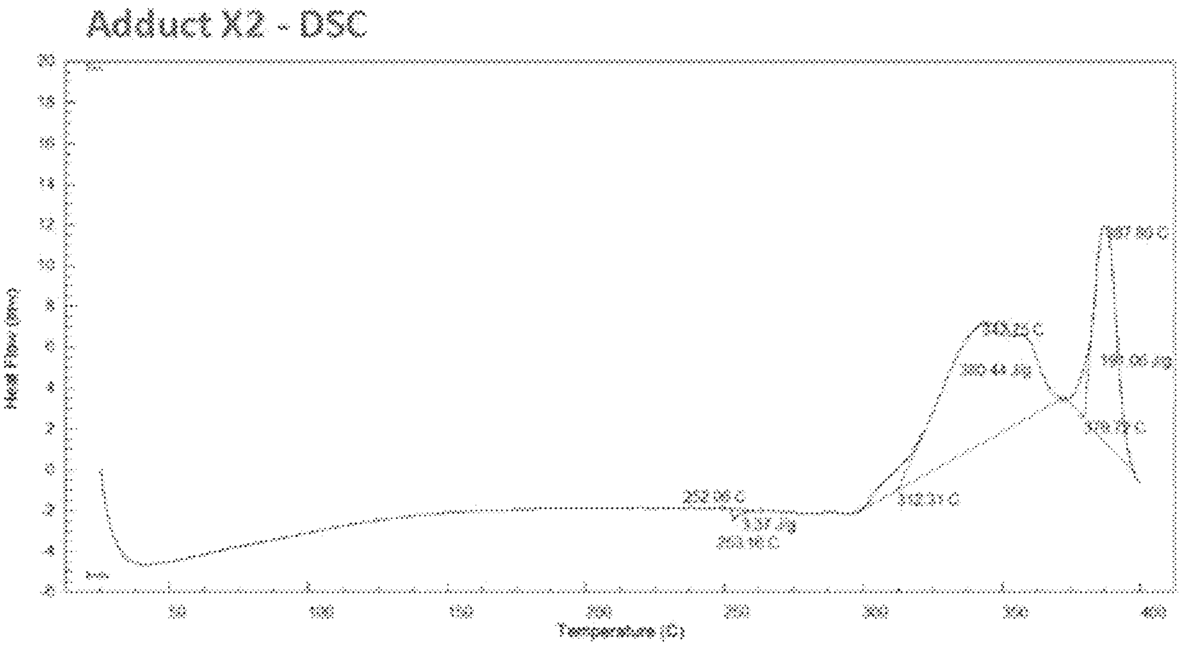
Figure 8:
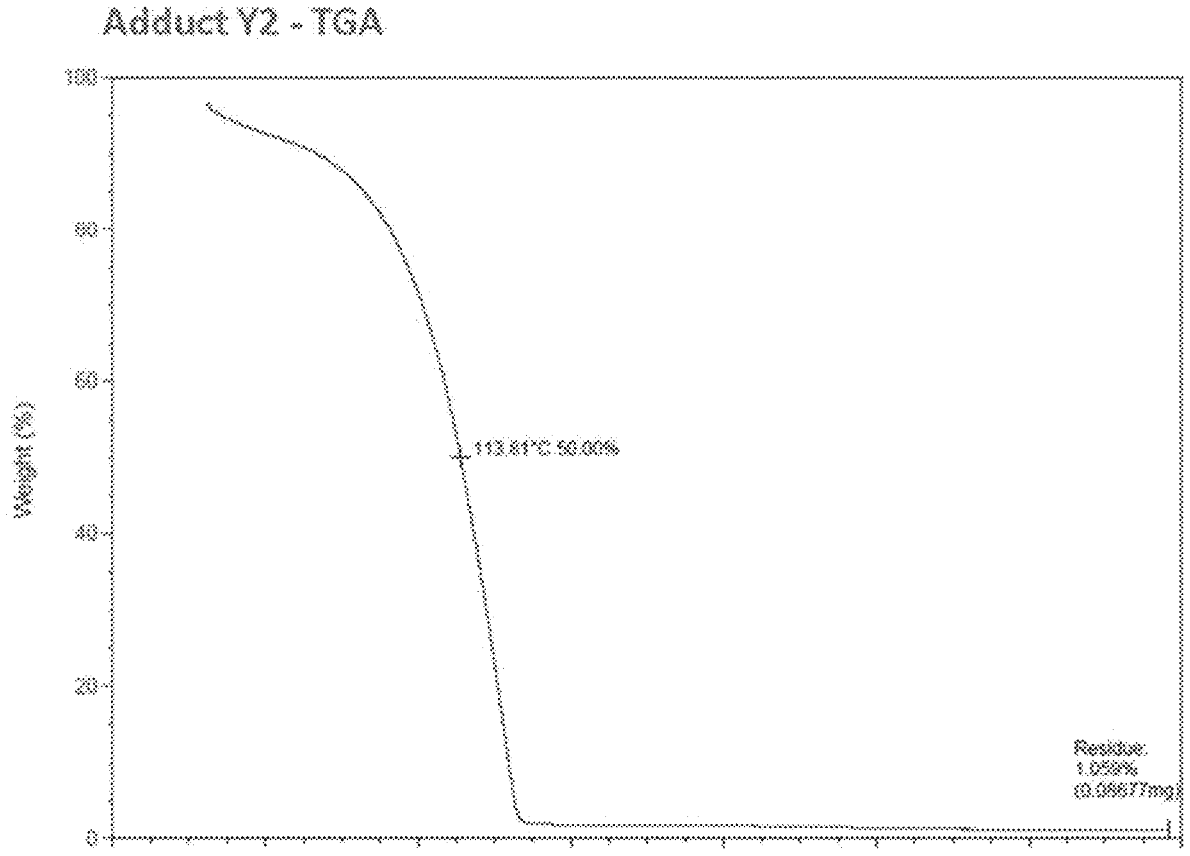
Figure 9:
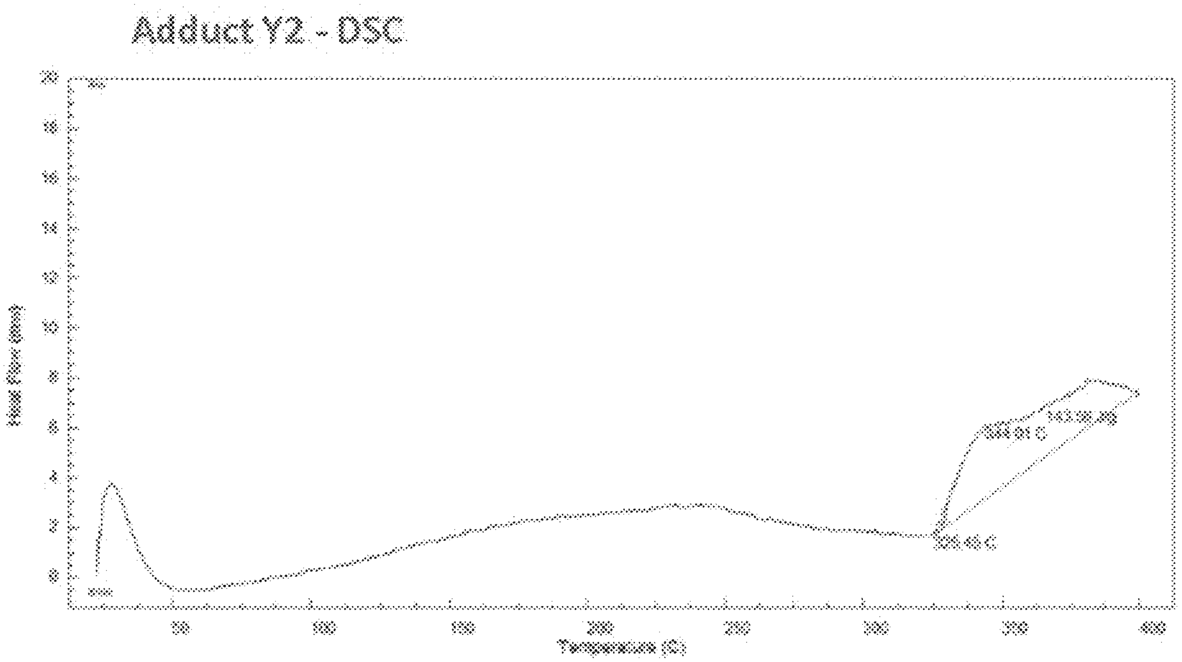

FIG. 3 is a 1H-NMR graph of precursor Y2 according to Example 3 of the present invention, and shows the NMR spectrum of Example 3/ethyl propyl ether/trimethyl aluminum.

The peaks at δ=0.89 ppm, 1.12 ppm, and 1.55 ppm with chemical shifts derived from ethyl propyl ether shifted to 0.65 ppm, 0.89 ppm, and 1.35 ppm, respectively, without changing the shape of the peaks even after precursor Y2 was formed.

It can be seen that the peak of chemical shift δ=−0.36 ppm derived from trimethyl aluminum also moves finely without changing its shape after formation of precursor Y2 to form a stable precursor. It can be confirmed that the integral ratio of Ha(9H):Hb(3H) is about 9:5.7, and two molecules of ethyl propyl ether form a precursor.

Thermal Analysis

FIGS. 4 to 9 are graphs showing differential scanning calorimetry (DSC) test results and thermogravimetric analysis (TGA) test results for Examples 1 to 3. A differential scanning calorimetry (DSC) test and a thermogravimetric analysis (TGA) test were performed on X1, X2, Y2 obtained in Examples 1 to 3, and the thermal analysis test conditions for measuring the thermal decomposition temperature in each test are as follows.

Transfer gas: Argon (Ar) gas

Transfer gas flow rate: 200 ml/min

Heating profile: heating from 30° C. to 500° C. at a heating rate of 10° C./min

In the DSC test, the thermal decomposition temperature was determined as the temperature at the point where the heat flow suddenly rises when the temperature is raised in the DSC thermogram.

Referring to [Table 1] below, it can be seen that both X1 and X2 have excellent vaporization characteristics and the amount of residual components is 0.1% or less, leaving no impurities in the thin layer. In addition, the decomposition temperature is higher than 340° C., and compared to the use of TMA alone, organic molecules effectively block the Al—Al interaction between TMA, resulting in a high decomposition temperature and improved thermal stability, so that it can be delivered to the surface of the substrate in a stable gas phase.

TABLE 1

| | T1/2(° C.) | TGA Residue(%) | DSC Decomposition temperature(° C.) |
|---|---|---|---|
| TMA | 66 | <0.1 | 319 |
| X1 | 103 | <0.1 | 346 |
| X2 | 99 | <0.1 | 343 |
| Y2 | 113 | 1.1 | 344 |

In addition, despite the fact that X2 has a larger molecular weight than X1, the vaporization characteristics are further improved, so it seems that two molecules of organic substances effectively block the Al—Al interaction between TMA, and X2 is more appropriate in terms of stability.

In addition, Y2 is also confirmed to have vaporization characteristics suitable for use as an ALD precursor due to a two-molecule blocking effect, and the decomposition temperature is higher than 344° C., resulting in improved thermal stability compared to the use of TMA alone, so that it can be delivered to the surface of the substrate in a stable gas phase.

Outdoor Exposure Test

Figure 10:
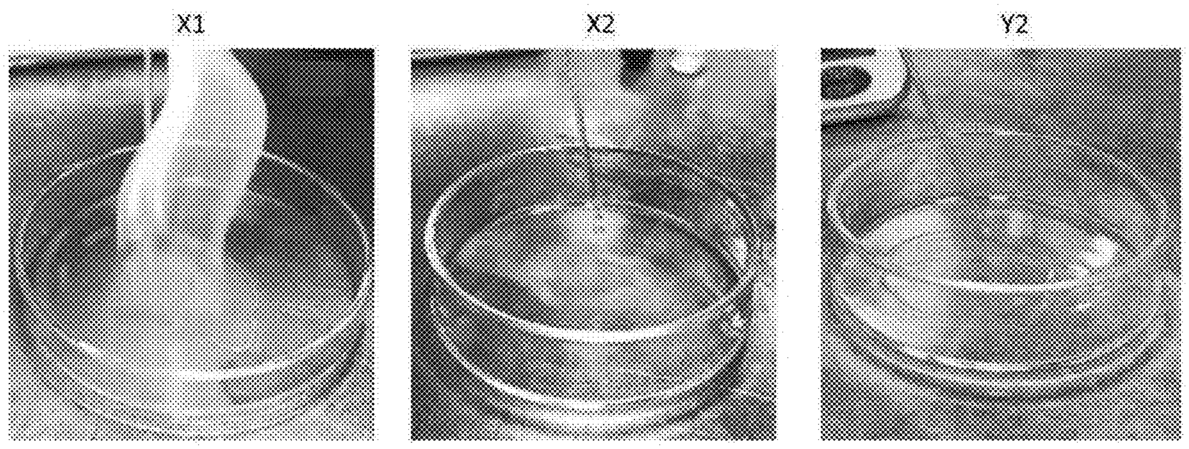
FIG. 10 is a photograph showing the results of the outdoor air exposure test for Examples 1 to 3.

FIG. 10 is a photograph showing the results of the outdoor air exposure test for Examples 1 to 3. Equal amounts of X1, X2, and Y2 obtained in Examples 1 to 3 were exposed to room temperature/pressure. In the case of X1, it ignited as soon as it was exposed in the pipette state, but in the case of X2/Y2, only fine fumes were generated and did not ignite. It can be confirmed that the flammability in the air is extremely reduced and does not ignite even in the air. The suppression of spontaneous ignition of X2/Y2 compared to X1 can be seen as an effect of forming a very stable material by completely blocking the empty P orbital of Al by two molecules.

Figure 11:
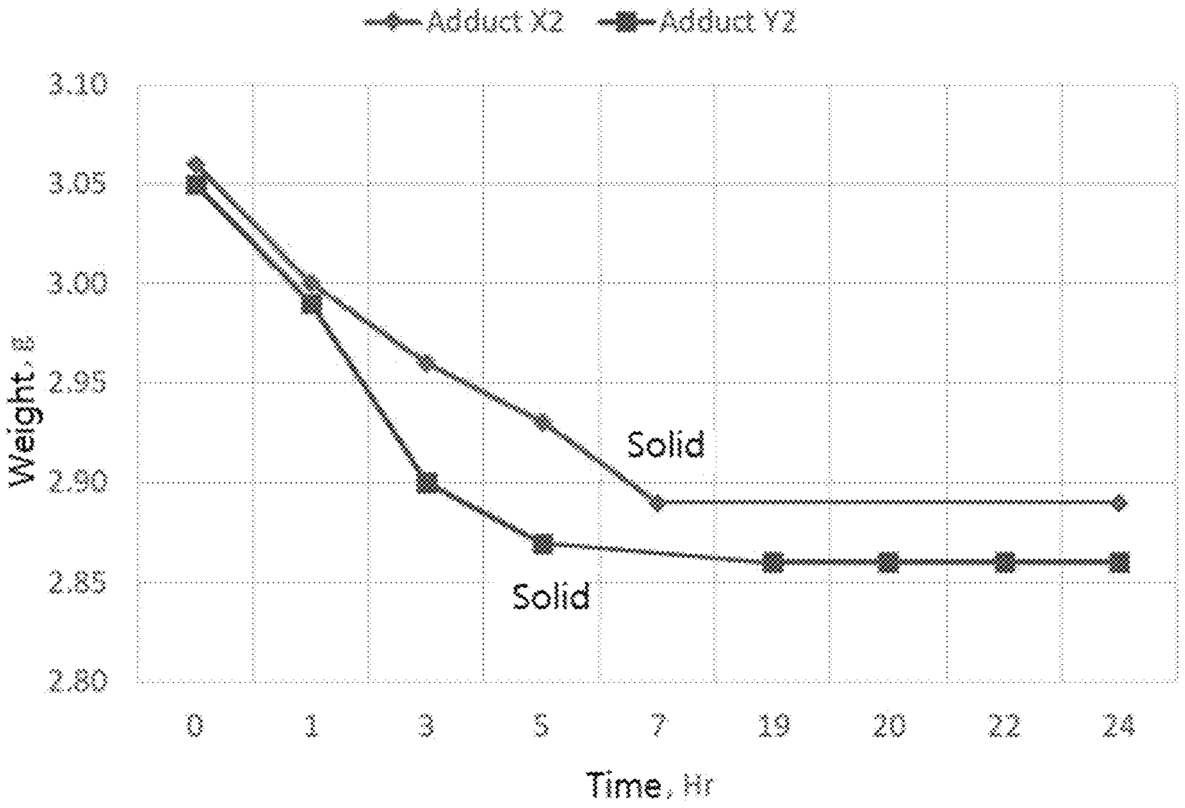
FIG. 11 is a graph showing the weight change after exposure to the outside air for Examples 2 and 3.
Figure 12:
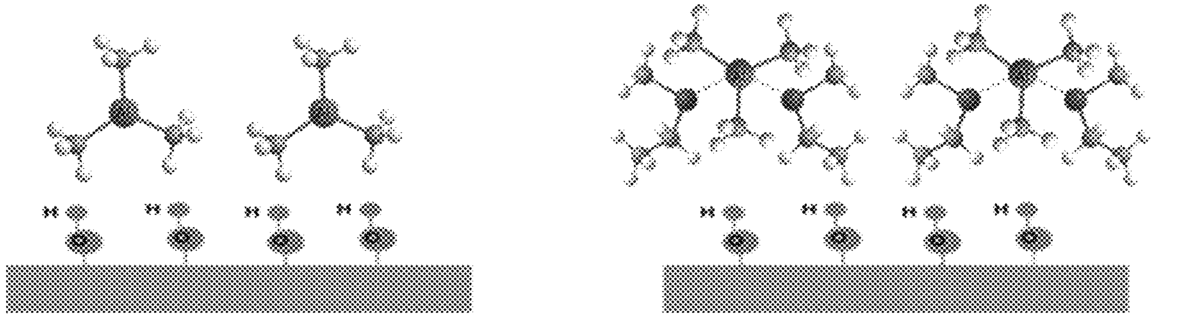
FIG. 12 is a schematic diagram comparing TMA with the Examples of the present invention.

FIG. 11 is a graph showing the weight change after exposure to the outside air for Examples 2 and 3. As a result of exposing the same amount of X2/Y2 to the outside air, in the case of Y2, the weight rapidly decreased and all solidified after 5 hours, and no further weight change occurred. However, in the case of X2, the weight reduction rate was relatively slow, and after 7 hours, all of them were solidified, and no more weight change occurred.

In both cases, oxidation reaction occurs, but ignition does not occur, so stability during handling is greatly increased and the risk of accidents can be greatly reduced.

The outdoor exposure test of FIGS. 10 and 11 can be seen as similar to the chemical reaction in which the precursor adsorbs on the surface. When exposed to the outside air, the precursor reacts with H2O in the air and undergoes a chemical reaction in which the Al—C bond is broken and replaced with an Al—O bond. This is because it is very similar to the reaction in which the —OH* terminated surface of the oxide film and the precursor meet and the ligand is dropped and adsorbed.

From the results of FIGS. 10 and 11, it can be seen that the empty P orbital of Al is completely blocked with an organic material in all of the X2 and Y2 precursors of the examples, so that the oxidation reaction occurs very slowly even when exposed to the outside air, and the reactivity is greatly reduced. The low reactivity of the completely blocked precursor can be confirmed in the schematic diagram of FIG. 12.

In addition, the diameter of the X2 precursor is about 6.6 Å, which greatly increases in size compared to the TMA diameter of 4.1 Å. This not only further reduces the accessibility of the surface —OH* to the Al center of the X2 precursor, but also reduces the deposition thickness per cycle because steric hindrance is greater when some adsorbed precursors exist on the surface. It can be confirmed through the deposition results using the X2 precursor in FIG. 13.

Similarly, the X2 and Y2 precursors have reduced reactivity with —OH* terminating groups on the surface, resulting in a reduced sticking coefficient and increased diffusion on the surface to form a uniform film, and finally uniformity and Step coverage can be improved.

Comparative Example 1: TMA Deposition Result

An aluminum oxide film was formed on the silicon substrate. An aluminum oxide film was formed through an ALD process, the ALD process temperature was 250 to 400° C., and O3 gas) was used as a reaction material.

The process of forming the aluminum oxide film through the ALD process is as follows, and the following process was performed as one cycle.

1) Ar is used as a carrier gas, the aluminum precursor TMA (Trimethylaluminium) is supplied to the reaction chamber at room temperature and the aluminum precursor is adsorbed on the substrate
2) Ar gas is supplied into the reaction chamber to discharge unadsorbed aluminum precursors or by-products
3) O3 gas is supplied to the reaction chamber to form a monolayer
4) Ar gas is supplied into the reaction chamber to discharge unreacted substances or by-products As a result of measuring the thickness of the aluminum oxide film obtained by the above process, the thickness of the aluminum oxide film obtained for each cycle of the ALD process was about 0.9 Å/cycle at 250 to 400° C.

Figure 13:
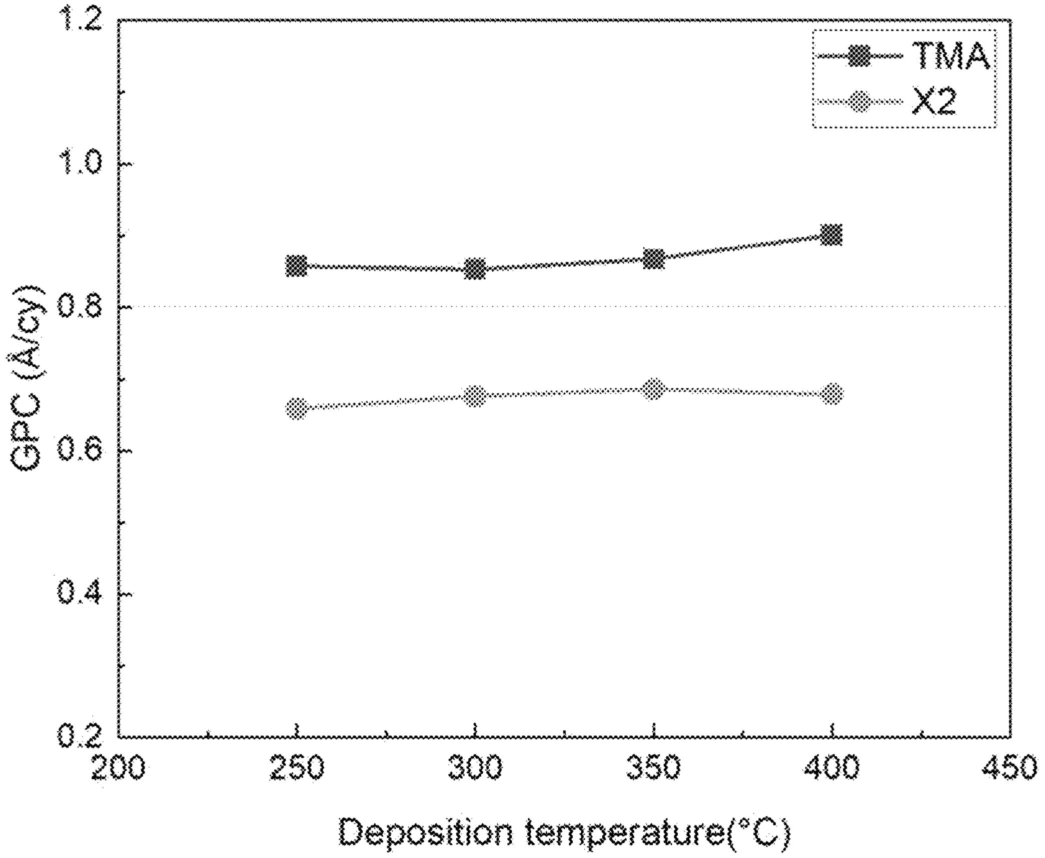
FIG. 13 is a graph showing GPC (Growth Per Cycle) of aluminum oxide films according to Comparative Example 1 and Example 2 of the present invention according to process temperature.

FIG. 13 is a graph showing GPC (Growth Per Cycle) of aluminum oxide films according to Comparative Example 1 and Example 2 of the present invention according to process temperature. As shown in FIG. 13, within the range of the substrate temperature of 250 to 400° C., the ideal ALD behavior was shown with little change in GPC according to the increase in the temperature of the substrate. Assuming that the total thickness of the dielectric film in the $ZrO_2$/$Al_2O_3$/$ZrO_2$ composite dielectric film of DRAM is 50 Å and the Al2O3 of Comparative Example 1 is used for about 3 cycles, the EOT of the dielectric film is 5.93 Å.

Example 2: Deposition Result of TMA-EMS

An aluminum oxide film was formed on a silicon substrate using the precursor X2 according to Example 2 of the present invention. An aluminum oxide film was formed in the same manner as in Comparative Example 1, except for changing the precursor.

As a result of measuring the thickness of the aluminum oxide film obtained by the above process, the thickness of the aluminum oxide film obtained for each cycle of the ALD process was about 0.7 Å/cycle at 250 to 400° C.

In addition, as shown in FIG. 13, within the range of the substrate temperature of 250 to 400° C., the ideal ALD behavior was shown with little change in GPC according to the increase in the temperature of the substrate, and a reduction effect of about 20% compared to Comparative Example 1 is shown.

Assuming that the total thickness of the dielectric film in the $ZrO_2$/$Al_2O_3$/$ZrO_2$ composite dielectric film of DRAM is 50 Å and the Al2O3 of Example 2 is used for about 3 cycles, the EOT of the dielectric film is 5.72 Å, and a scaling down of about 4% compared to Comparative Example 1 can be secured.

On the other hand, in the conventional deposition process using a single precursor in a trench structure having a high aspect ratio (for example, 40:1 or more), a thin layer deposited on an upper part (or an entrance) of the trench becomes thicker, and a thin layer deposited on a lower part (or a bottom) of the trench becomes thinner. Therefore, the step coverage of the thin layer is poor and not uniform.

However, the surface protection material described below behaves in the same manner as the metal precursor, and the surface protection material is adsorbed at a higher density in the upper part of the trench than in the lower part of the trench to impede the adsorption of the metal precursor in a subsequent process, therefore the metal precursor reacts with a reaction material to form the thin layer having an uniform thickness in the trench.

Figure 14:
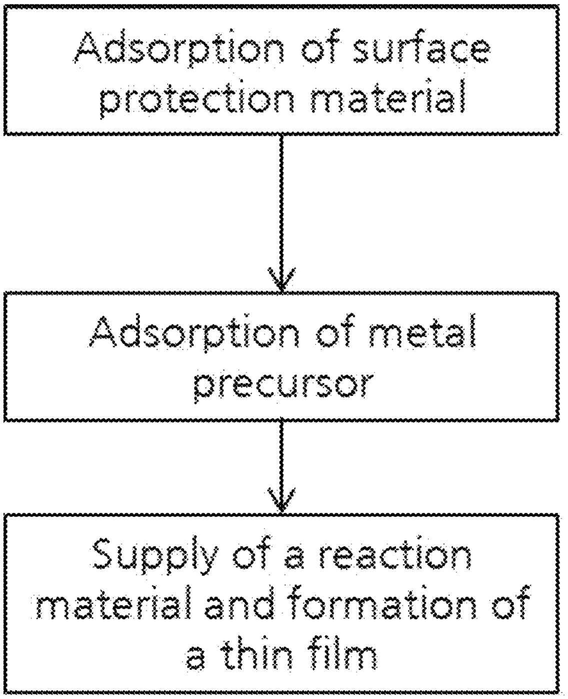
FIG. 14 is a flowchart schematically illustrating a method of forming a thin layer according to Examples of the present invention.
Figure 15:
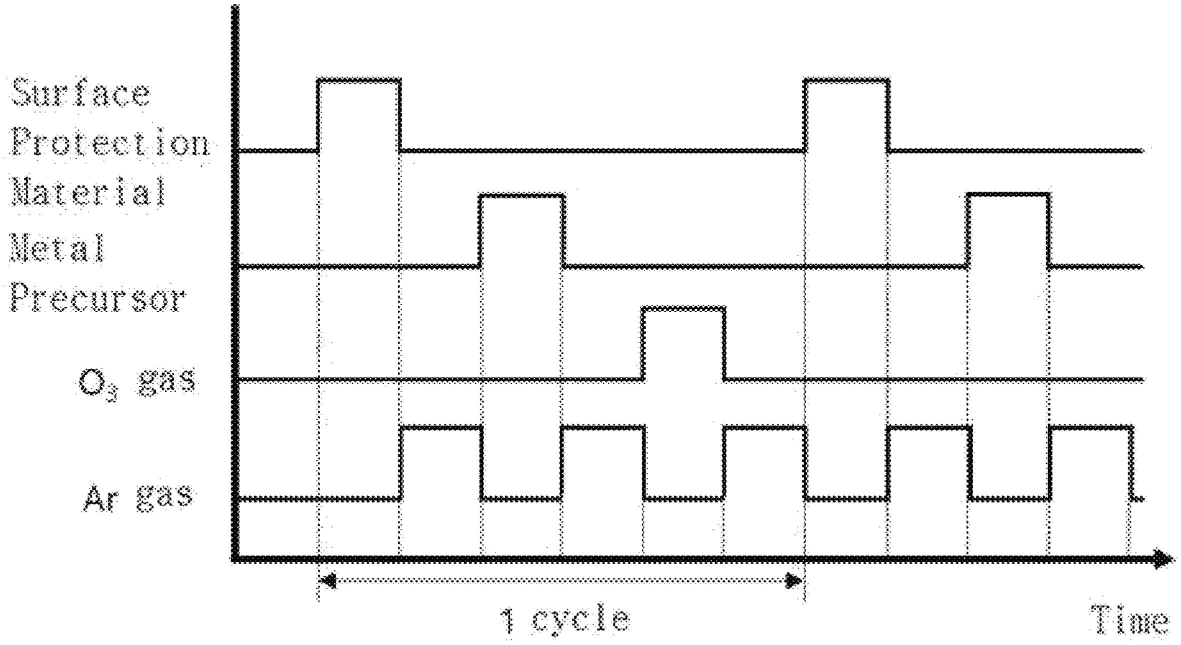
FIG. 15 is a graph schematically showing a supply cycle according to Examples of the present invention.

FIG. 14 is a flowchart schematically demonstrating a method of forming a thin layer according to Examples of the present invention, FIG. 15 is a graph schematically demonstrating a supply cycle according to an embodiment of the present invention. A substrate is loaded into a process chamber, and following ALD process conditions are adjusted. ALD process conditions may include a temperature of the substrate or process chamber, a pressure in the process chamber, gas flow rate, and the temperature is 50 to 700° C.

The substrate is exposed to the surface protection material supplied to the interior of the chamber, and the surface protection material is adsorbed to the surface of the substrate. The surface protection material has a similar behavior to the metal precursor during the deposition process, in case of a trench structure having a high aspect ratio (for example, 40:1 or more), so that it is adsorbed at a high density in the entrance of the trench and at a low density in the bottom of the trench to impede the adsorption of the metal precursor in a subsequent process.

Specifically, the metal precursor is formed by mixing 1 to 3 moles of a compound represented by the following Chemical Formula 1 or following Chemical Formula 2 and 1 to 3 moles of a compound represented by the following Chemical Formula 3.

<Chemical Formula 1>

wherein X is O or S, and R1 or R2 is each independently selected from an alkyl group having 1 to 8 carbon atoms, a cycloalkyl group having 3 to 6 carbon atoms, and an aryl group having 6 to 12 carbon atoms.

<Chemical Formula 2>

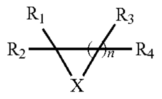

wherein X is O or S, n is 1 to 5, and R1 to R4 are each independently selected from a hydrogen atom, an alkyl group having 1 to 5 carbon atoms, a cycloalkyl group having 3 to 6 carbon atoms, and an aryl group having 6 to 12 carbon atoms.

<Chemical Formula 3>

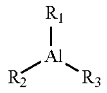

wherein R1, R2 and R3 are different from each other, and each independently selected from a hydrogen atom, an alkyl group having 1 to 6 carbon atoms, a dialkylamine having 1 to 6 carbon atoms, a cycloamine group having 1 to 6 carbon atoms, or a halogen atom.

The metal precursor may be formed by mixing ethyl methyl sulfide or ethyl propyl ether or tetrahydrofuran with trimethylaluminum.

Also, the surface protection material may be represented by the following Chemical Formula 4:

<Chemical Formula 4>

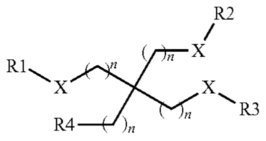

Wherein n is each independently an integer of 0 to 6, X is O or S, R1 to R3 are independently an alkyl group having 1 to 6 carbon atoms, R4 is selected from hydrogen, an alkyl group having 1 to 6 carbon atoms, an alkoxy group having 1 to 6 carbon atoms, and an alkylthio group having 1 to 6 carbon atoms.

Thereafter, a purge gas (for example, an inert gas such as Ar) is supplied to the interior of the chamber to discharge the unadsorbed surface protection material or by-products.

Thereafter, the substrate is exposed to a metal precursor supplied to the interior of the chamber, and the metal precursor is adsorbed on the surface of the substrate. The metal precursor is supplied at 50 to 700° C.

For example, the surface protection material described above is adsorbed in the entrance of the trench more densely than in the bottom of the trench, and the metal precursor cannot be adsorbed at the position where the surface protection material is adsorbed. That is, in the conventional deposition process, the metal precursor is adsorbed in the entrance of the trench more densely than in the bottom of the trench to have a high density in the entrance of the trench. But, in the present invention, the surface protection material is adsorbed in the entrance of the trench more densely than in the bottom of the trench to impede the adsorption of the metal precursor in the entrance of the trench, therefore, the metal precursor can be uniformly adsorbed in the trench without over-adsorption on the entrance of the trench, and the step coverage of the thin layer described below can be improved.

Thereafter, a purge gas (for example, an inert gas such as Ar) is supplied to the interior of the chamber to discharge the unadsorbed metal precursors or by-products.

Thereafter, the substrate is exposed to a reaction material supplied to the interior of the chamber, and a thin layer is formed on the surface of the substrate. The reaction material reacts with the metal precursor to form the thin layer, and the reaction material may be water vapor (H2O), oxygen (O2) and ozone (O3). A metal oxide film may be formed by the reaction. At this time, the reaction material oxidizes the adsorbed surface protection material, and the adsorbed surface protection material may be separated and removed from the surface of the substrate. The thin layer is formed at 50 to 700° C., the thin layer may be any one of aluminum oxide, aluminum nitride, aluminum sulfide.

Thereafter, a purge gas (for example, an inert gas such as Ar) is supplied to the interior of the chamber to discharge the surface protective material/unreacted material or by-products.

On the other hand, it was previously described that the surface protection material is supplied before the metal precursor. Alternatively, the surface protection material may be supplied after the metal precursor or the metal precursor may be supplied both before and after the surface protection material.

Comparative Example 1-1: Deposition Result Using TMA and Surface Protection Material TMOF An aluminum oxide film was formed on a silicon substrate using trimethyl orthoformate (TMOF) according to the above <Chemical Formula 4> as a surface protection material. The aluminum oxide film was formed in the same manner as in Comparative Example 1, except for using the surface protection material.

The process of forming the aluminum oxide layer through the ALD process is as follows, and the following process is performed as one cycle.

1) A surface protection material is supplied to the reaction chamber to be adsorbed onto the substrate
2) Ar gas is supplied into the reaction chamber to discharge unadsorbed surface protection materials or by-products
3) Ar is used as a carrier gas, the aluminum precursor is supplied to the reaction chamber at room temperature, and the aluminum precursor is adsorbed onto the substrate
4) Ar gas is supplied into the reaction chamber to discharge unadsorbed aluminum precursors or by-products
5) O3 gas) is supplied to the reaction chamber to form a monolayer
6) Ar gas is supplied into the reaction chamber to discharge unreacted substances or by-products

Example 2-1: Deposition Result Using TMA-EMS and Surface Protection Material TMOF An aluminum oxide film was formed on a silicon substrate using trimethyl orthoformate (TMOF) according to the above <Chemical Formula 4> as a surface protection material. An aluminum oxide film was formed in the same manner as in Comparative Example 1-1, except for changing the precursor.

Example 4: Manufacture and Deposition Results of TMA-THF

An Al precursor was formed by mixing THF (Tetrahydrofuran) and TMA according to <Chemical Formula 2> of the present invention. In a glove box at room temperature, 10 g (0.139 mol) of tetrahydrofuran was added to a 500 ml round flask, and 10 g (0.139 mol) of trimethyl aluminum was added very slowly to obtain a precursor TMA-THF.

It was confirmed that the chemical shift peaks of δ=3.57 ppm and 1.42 ppm derived from EMS shifted to 3.35 ppm and 0.96 ppm, respectively, without changing the shape of the peaks even after the formation of the precursor, thereby forming a stable material.

An aluminum oxide film was formed on a silicon substrate using the manufactured TMA-THF. An aluminum oxide film was formed in the same manner as in Comparative Example 1, except for changing the precursor.

Example 4-1: Deposition Result Using TMA-THF and Surface Protection Material TMOF An aluminum oxide film was formed on a silicon substrate using trimethyl orthoformate (TMOF) according to the above <Chemical Formula 4> as a surface protection material, respectively. An aluminum oxide film was formed in the same manner as in Comparative Example 1-1, except for changing the precursor.

Outdoor Exposure Test

Figure 16:
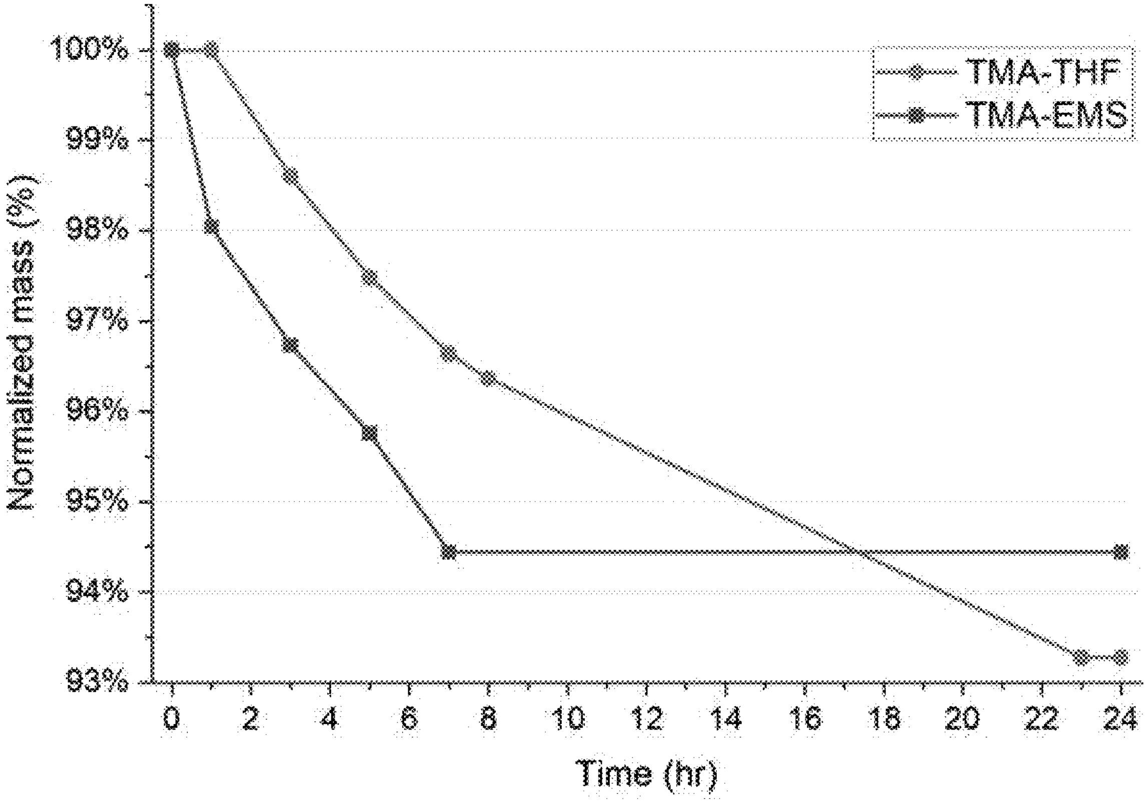
FIG. 16 is a graph showing the weight change after exposure to the outside air for Examples 2 and 4.

FIG. 16 is a graph showing the weight change after exposure to the outside air for Examples 2 and 4. It was confirmed that both precursors had extremely reduced inflammability in the air and existed in a liquid state without igniting even in the air. Suppression of spontaneous ignition can be seen as an effect of forming a very stable material by completely blocking the empty P orbital of Al with organic molecules.

It can be seen that the weight loss of both precursors is very slow and the oxidation reaction rate is slow. The outdoor exposure test can be seen as similar to the chemical reaction in which the precursor adsorbs on the surface. When exposed to the outside air, the precursor reacts with H2O in the air and undergoes a chemical reaction in which the Al—C bond is broken and replaced with an Al—O bond. This is because it is very similar to the reaction in which the —OH* terminated surface of the oxide film and the precursor meet and the ligand is dropped and adsorbed. Therefore, it can be inferred that the decrease in the reactivity of the Al precursor in the air also occurs in the surface reaction.

Figure 17:
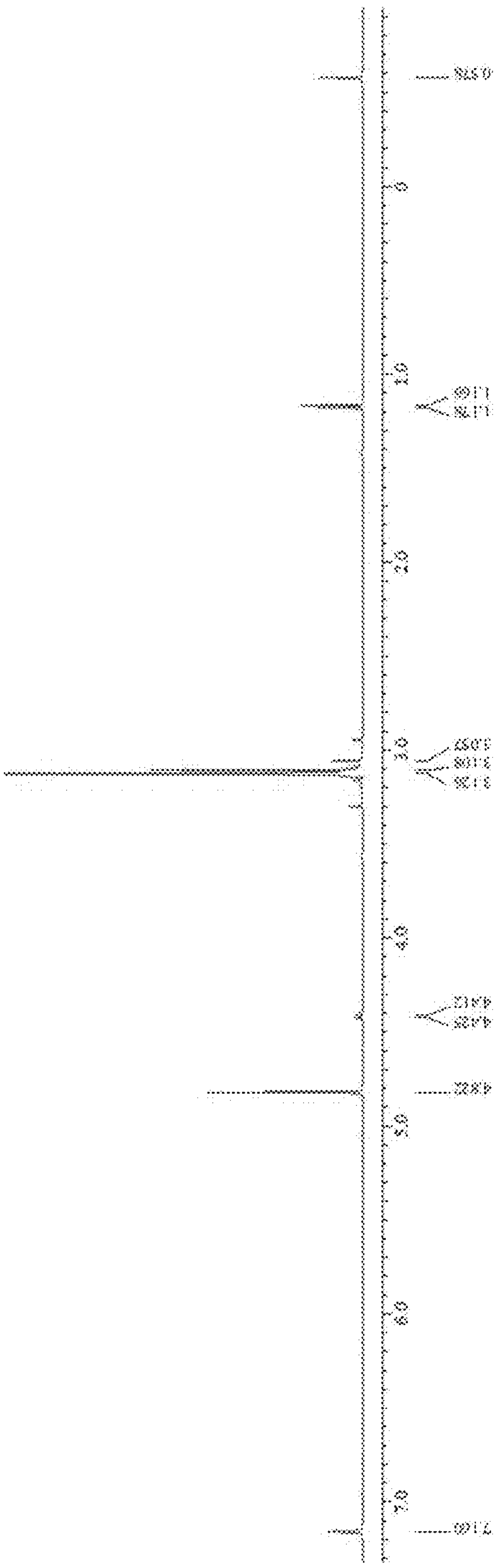
FIG. 17 is a graph showing the result of mixing the precursor TMA and the surface protection material TMOF in a liquid phase corresponding to Comparative Example 1-1.

FIG. 17 is a graph showing the result of mixing the precursor TMA and the surface protection material TMOF in a liquid phase corresponding to Comparative Example 1-1. In order to simulate the reaction with the surface protection material on the surface, the precursor corresponding to Comparative Example 1-1 and the surface protecting material were mixed in a liquid phase.

After slowly adding 1 equivalent of Trimethyl Aluminum to 6 equivalents of Trimethyl orthoformate, the mixture was sufficiently stirred. Peak assignment was performed by 1H NMR (C6D6) analysis of the mixed solution.

TMOF, $HC(OCH_3)_2$: δ 4.82 (s), 3.12 (s)

$(CH_3)_2Al(OCH_3)$: δ 3.05 (s), −0.57 (s)

$CH_3CH(OCH_3)_2$: δ 4.42 (m), 3.10 (s), 1.17 (d)

Due to the excessive addition of trimethyl orthoformate, δ 4.82 and 3.12 resulting from the unreacted surface protecting material were confirmed, and the product peak formed by the Ligand substitution reaction between the precursor and the surface protection material was confirmed. It was confirmed that δ −0.36 caused by Trimethyl Aluminum before the reaction disappeared and the reaction was complete.

Figure 18:
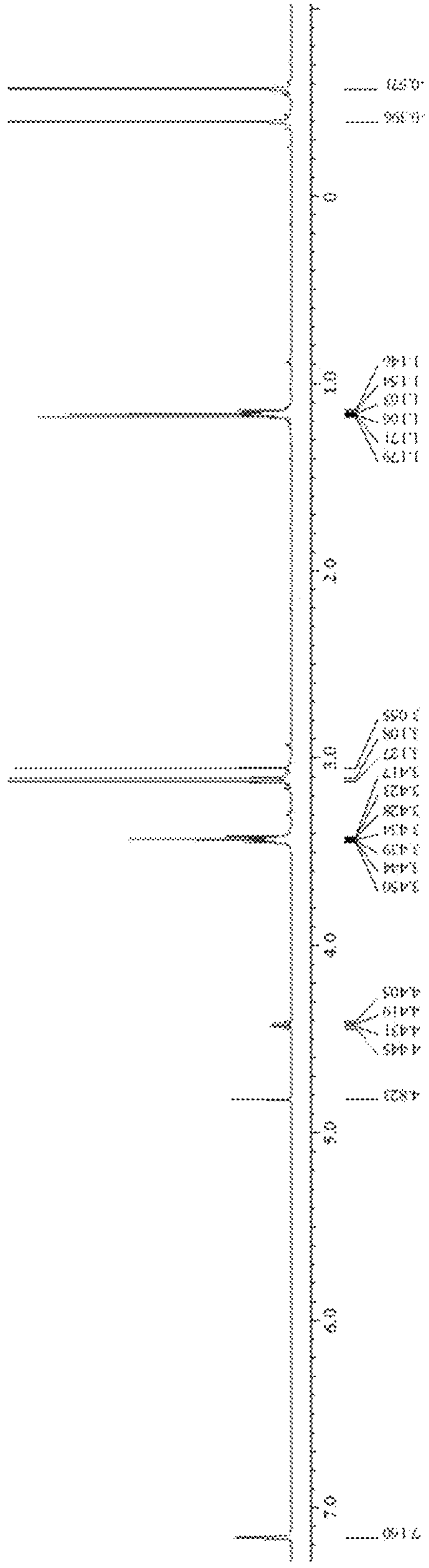
FIG. 18 is a graph showing the result of mixing the precursor TMA-THF and the surface protection material TMOF in a liquid phase corresponding to Example 4-1.

FIG. 18 is a graph showing the result of mixing the precursor TMA-THF and the surface protection material TMOF in a liquid phase corresponding to Example 4-1. The precursor corresponding to Example 4-1 and the surface protection material were mixed in a liquid phase.

After slowly adding 1 equivalent of TMA-THF to 1 equivalent of Trimethyl orthoformate, the mixture was sufficiently stirred. Peak assignment was performed by 1H NMR (C6D6) analysis of the mixed solution.

TMOF, $HC(OCH_3)_2$: δ 4.82 (s), 3.12 (s)

TMA-THF: δ 3.43 (m), δ 1.16 (m), −0.39 (s)

$(CH_3)_2Al(OCH_3)$: δ 3.05 (s), −0.57 (s)

$CH_3CH(OCH_3)_2$: δ 4.42 (m), 3.10 (s), 1.17 (d)

The product peak formed by the Ligand substitution reaction of the precursor and the surface protection material was confirmed in the same way as the previous result. However, TMA-THF/Trimethyl orthoformate peaks that did not react are confirmed, differently from the fact that all of the trimethyl aluminum precursors reacted and disappeared. This can also be interpreted as a very low reactivity of TMA-THF and the surface protection material, and it leads to a decrease in the sticking coefficient and an increase in diffusion on the surface in the surface reaction during deposition, resulting in expectation of the improvement in step coverage compared to conventional precursors.

[Table 2] below shows the GPC (Growth Per Cycle) of the aluminum oxide film according to Comparative Example and Examples 2 and 4 of the present invention.

TABLE 2

| | Precursor | Surface protection material | Deposition rate (Å/cycle) | Reduction rate of deposition rate compared to precursor (%) |
|---|---|---|---|---|
| Comparative Example 1 | TMA | — | 0.81 | — |
| Comparative Example 1-1 | | TMOF | 0.56 | 30.9% |
| Example 2 | TMA-EMS | — | 0.73 | — |
| Example 2-1 | | TMOF | 0.22 | 69.9% |
| Example 4 | TMA-THF | — | 0.65 | — |
| Example 4-1 | | TMOF | 0.20 | 69.2% |

Comparing the GPC of the Al precursors without using the surface protection material, it can be seen that the GPC of Examples 2 and 4 decreased by 26% and 23%, respectively, compared to the use of TMA alone. This can be interpreted as a decrease in the reactivity of the precursor due to the Al blocking effect and a decrease in the accessibility of the Al center and surface —OH* due to the increase in size compared to TMA.

The decrease in reactivity with —OH* terminating groups on the surface leads to a decrease in sticking coefficient and an increase in diffusion on the surface to form a uniform film, and finally uniformity and Step coverage can be improved.

It can be seen that the GPC reduction of the Al precursors using the surface protection material is further maximized. In Comparative Example 1-1, the reduction rate when only the surface protection material was applied was 30%, whereas in Example 4-1, when both the TMA-THF precursor and the surface protection material of the present invention were applied, it was confirmed that the reduction rate was greatly increased to a high reduction rate of 70%.

Assuming that the total thickness of the dielectric film in the $ZrO_2/Al_2O_3/ZrO_2$ composite dielectric film of DRAM is 50 Å and the Al2O3 of Example 2-1 is used for about 3 cycles, the EOT of the dielectric film is 5.21 Å, and a scaling down of about 12%, compared to the use of TMA alone in Comparative Example 1, can be secured.

Figure 19:
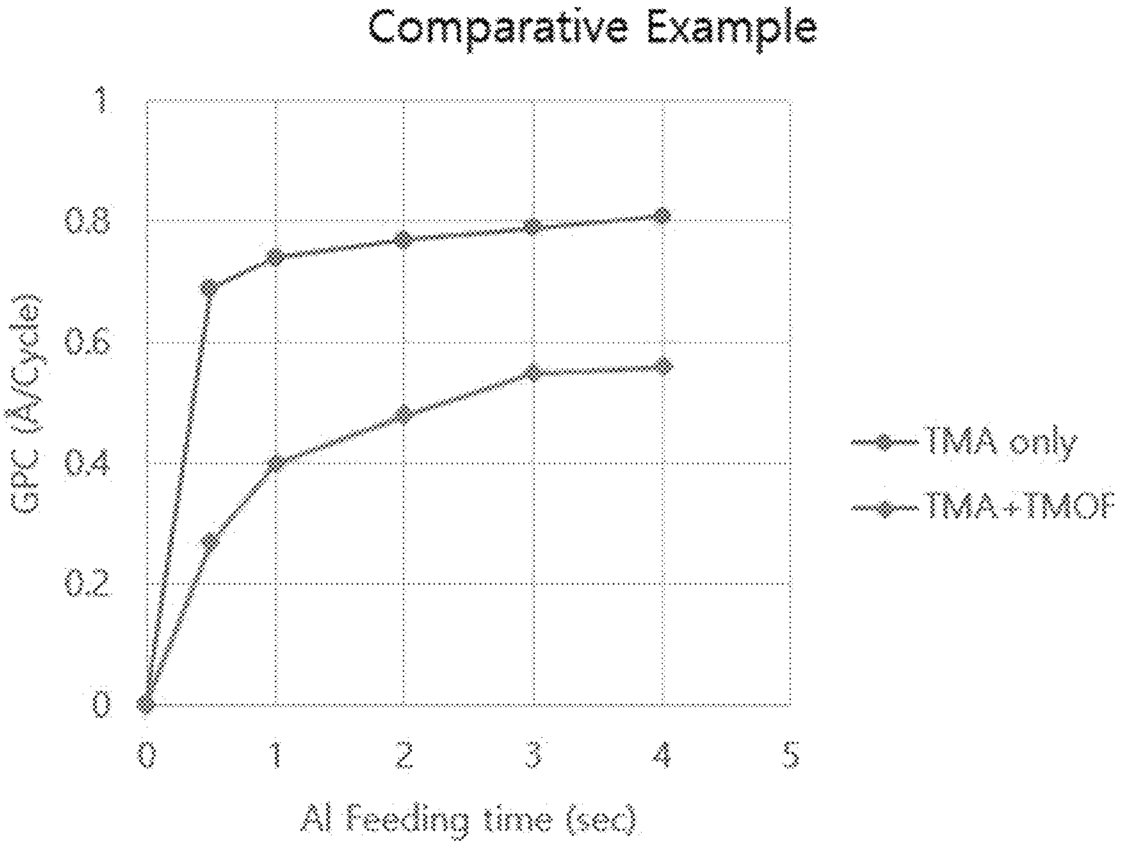
FIGS. 19 and 20 show GPC (Growth Per Cycle) of an aluminum oxide film according to an increase in precursor feeding time at the same deposition temperature.
Figure 20:
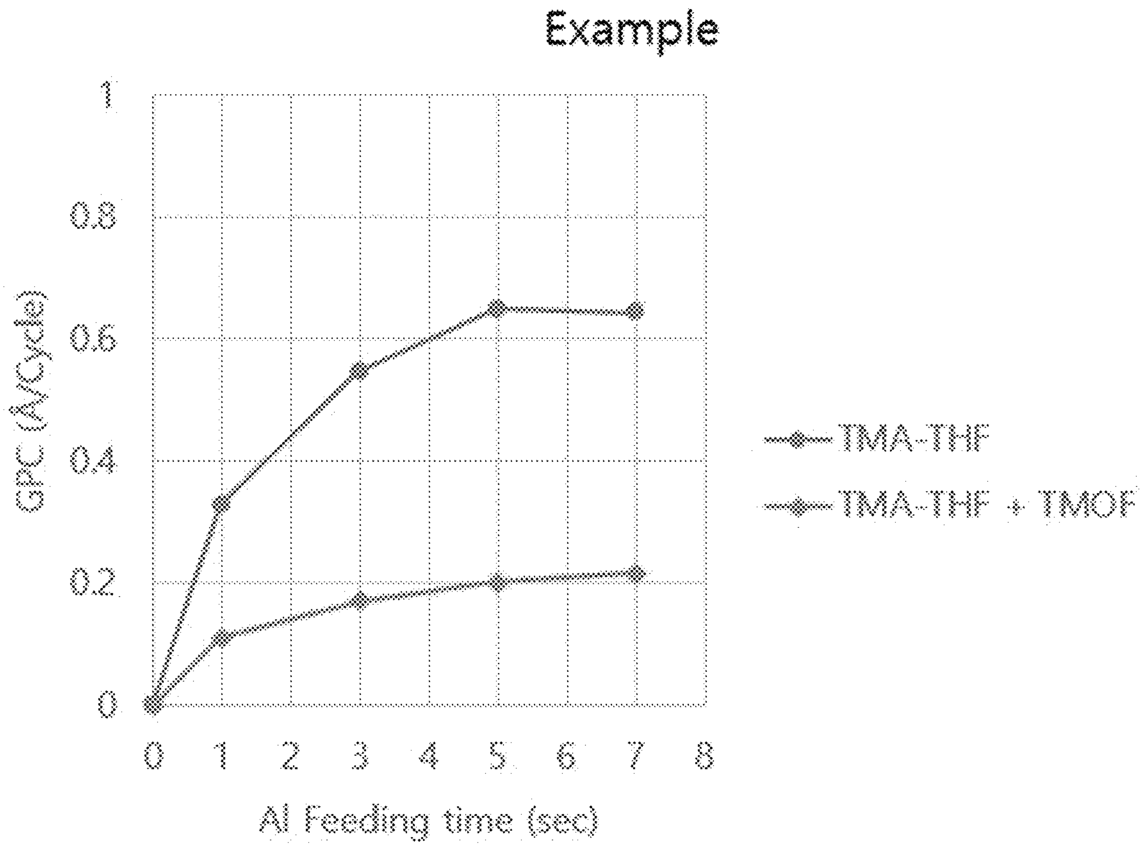

FIGS. 19 and 20 show GPC (Growth Per Cycle) of an aluminum oxide film according to an increase in precursor feeding time at the same deposition temperature.

In the comparative examples of FIG. 19, GPC to which the surface protection material was applied continuously increased as the precursor feeding time increased, and thus the saturation characteristics were not good and control was not easy. On the other hand, the GPC to which the surface protection material is applied in the Examples of FIG. 20 has a very low GPC compared to the precursor-only process, and shows saturation characteristics with a very small change in GPC even when the precursor feeding time increases, and is suitable for an ALD process.

Figure 21:
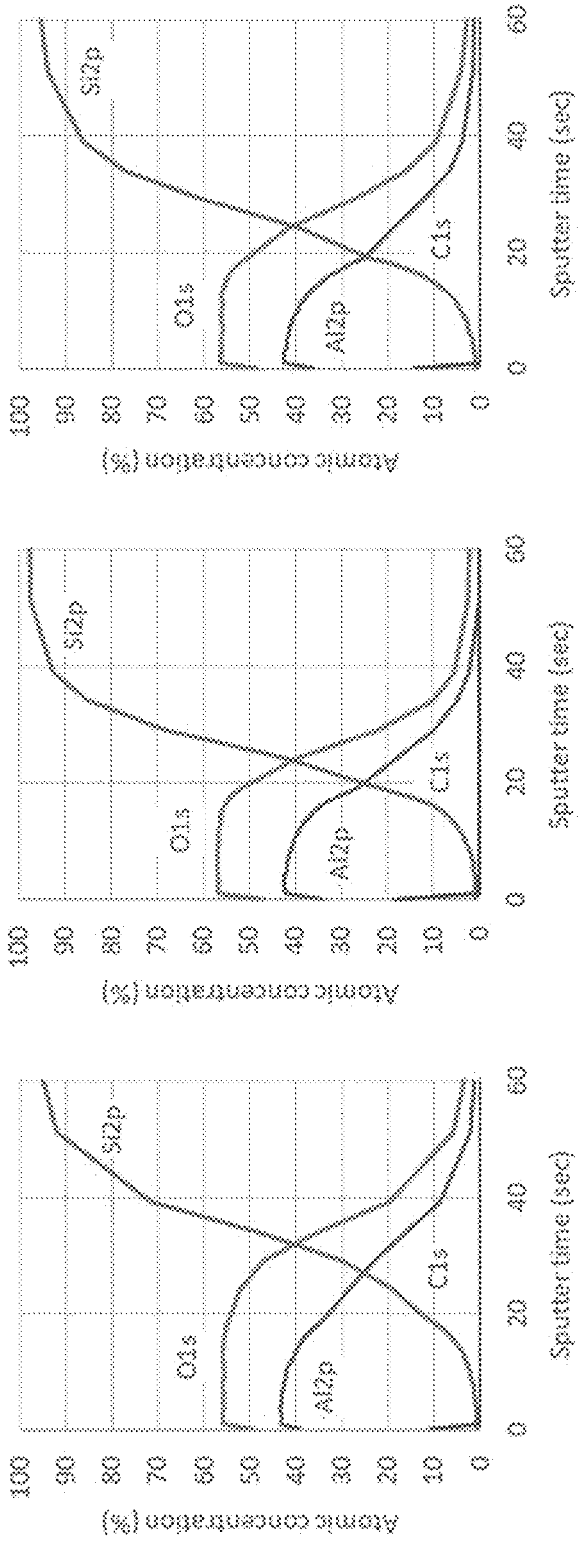
FIG. 21 is a graph showing an XPS Depth Profile for analyzing the surface of an aluminum oxide film according to Examples of the present invention.

FIG. 21 is a graph showing an XPS Depth Profile for analyzing the surface of an aluminum oxide film according to Examples of the present invention. The carbon concentration in the thin layer was 0%, and a thin layer without impurities was formed.

Figure 22:
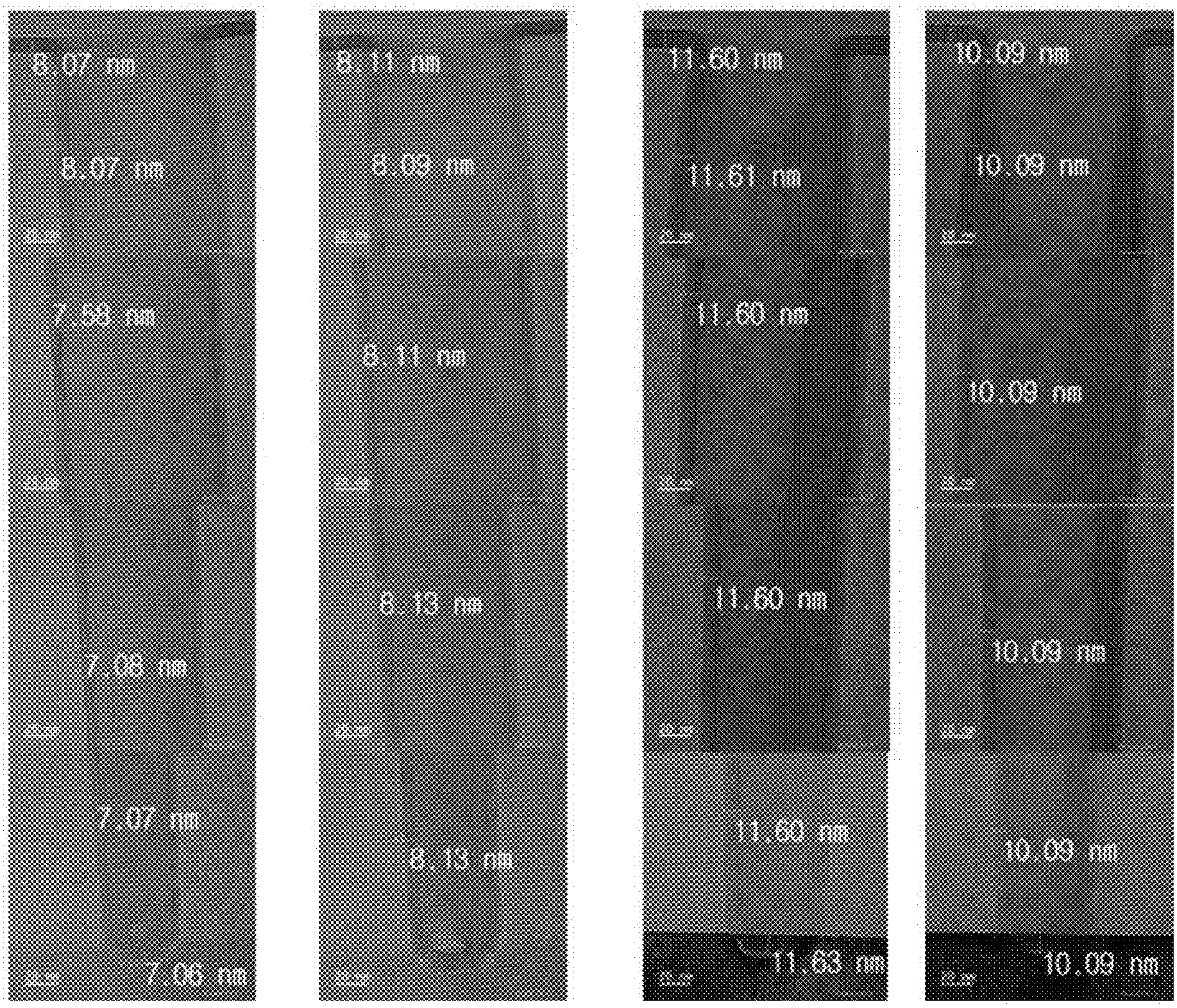
FIG. 22 is a result of confirming step coverage by depositing an aluminum oxide film according to Examples of the present invention on a pattern wafer.

FIG. 22 is a result of confirming step coverage by depositing an aluminum oxide film according to Examples of the present invention on a pattern wafer (Aspect ratio 20:1). In all examples, it was confirmed that excellent characteristics were exhibited with step coverage of 100%.

In conclusion, a high GPC reduction effect can be obtained by applying the Al precursor and surface protection material of the present invention, and through this, precise thickness control and excellent step coverage can be obtained, as well as electrical characteristics and reliability of the device can be improved. In addition, it is possible to form a thin layer with high purity without impurities and thinner than the thickness of one monolayer that can be obtained by the existing ALD process.

The present invention has been explained in detail with reference to embodiments, but other embodiments may be included. Accordingly, the technical idea and scope described in the claims below are not limited to the embodiments.

The invention claimed is:

1. A method for manufacturing an aluminum precursor formed by mixing 1 to 3 moles of a compound represented by the following Chemical Formula 1 or following Chemical Formula 2 and 1 to 3 moles of a compound represented by the following Chemical Formula 3, <Chemical Formula 1>

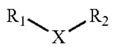

wherein X is O or S, and R1 or R2 is each independently selected from an alkyl group having 1 to 8 carbon atoms, a cycloalkyl group having 3 to 6 carbon atoms, and an aryl group having 6 to 12 carbon atoms, <Chemical Formula 2>

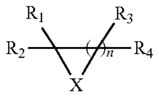

wherein X is O or S, n is 1 to 5, and R1 to R4 are each independently selected from a hydrogen atom, an alkyl group having 1 to 5 carbon atoms, a cycloalkyl group having 3 to 6 carbon atoms, and an aryl group having 6 to 12 carbon atoms, <Chemical Formula 3>

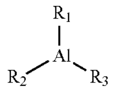

wherein R1, R2 and R3 are different from each other, and each independently selected from a hydrogen atom, an alkyl group having 1 to 6 carbon atoms, a dialkylamine having 1 to 6 carbon atoms, a cycloamine group having 1 to 6 carbon atoms, or a halogen atom, wherein the aluminum precursor is formed by mixing ethyl methyl sulfide and trimethylaluminum, or by mixing ethyl propyl ether and trimethylaluminum.

2. An aluminum precursor formed by mixing 1 to 3 moles of a compound represented by the following Chemical Formula 1 or following Chemical Formula 2 and 1 to 3 moles of a compound represented by the following Chemical Formula 3, <Chemical Formula 1>

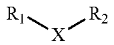

wherein X is O or S, and R1 or R2 is each independently selected from an alkyl group having 1 to 8 carbon atoms, a cycloalkyl group having 3 to 6 carbon atoms, and an aryl group having 6 to 12 carbon atoms, <Chemical Formula 2>

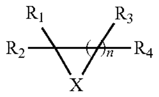

wherein X is O or S, n is 1 to 5, and R1 to R4 are each independently selected from a hydrogen atom, an alkyl group having 1 to 5 carbon atoms, a cycloalkyl group having 3 to 6 carbon atoms, and an aryl group having 6 to 12 carbon atoms, <Chemical Formula 3>

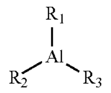

wherein R1, R2 and R3 are different from each other, and each independently selected from a hydrogen atom, an alkyl group having 1 to 6 carbon atoms, a dialkylamine having 1 to 6 carbon atoms, a cycloamine group having 1 to 6 carbon atoms, or a halogen atom, wherein the aluminum precursor is formed by mixing ethyl methyl sulfide and trimethylaluminum, or by mixing ethyl propyl ether and trimethylaluminum.

* * * * *